United States Patent
Jang

(10) Patent No.: US 11,218,657 B2
(45) Date of Patent: Jan. 4, 2022

(54) PIXEL AND IMAGE SENSOR INCLUDING THE SAME

(71) Applicant: SK hynix Inc., Icheon-si (KR)

(72) Inventor: Jae Hyung Jang, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 0 days.

(21) Appl. No.: 17/100,009

(22) Filed: Nov. 20, 2020

(65) Prior Publication Data

US 2021/0281791 A1    Sep. 9, 2021

(30) Foreign Application Priority Data

Mar. 4, 2020 (KR) .................. 10-2020-0027142

(51) Int. Cl.
| | |
|---|---|
| H04N 5/374 | (2011.01) |
| H04N 5/369 | (2011.01) |
| H04N 5/455 | (2006.01) |
| H04N 5/378 | (2011.01) |
| H04N 1/04 | (2006.01) |
| H04N 9/66 | (2006.01) |
| H04N 9/87 | (2006.01) |
| G01S 17/89 | (2020.01) |
| G01S 19/24 | (2010.01) |
| H01L 27/146 | (2006.01) |
| H04N 5/3745 | (2011.01) |
| G01S 17/894 | (2020.01) |

(52) U.S. Cl.
CPC ......... H04N 5/3745 (2013.01); G01S 17/894 (2020.01)

(58) Field of Classification Search
CPC .. H04N 5/3745; H04N 5/36965; H04N 5/455; H04N 1/0446; G01S 17/894; G01S 17/89; G01S 19/24; H01L 27/1461
See application file for complete search history.

(56) References Cited

U.S. PATENT DOCUMENTS

| | | | | |
|---|---|---|---|---|
| 10,141,369 | B2* | 11/2018 | Park | H01L 27/148 |
| 2017/0301708 | A1* | 10/2017 | Fotopoulou | H01L 27/146 |
| 2019/0252449 | A1* | 8/2019 | Ebiko | H01L 27/14643 |
| 2020/0003874 | A1* | 1/2020 | Moriyama | G01S 7/486 |
| 2020/0260043 | A1* | 8/2020 | Seo | H04N 5/3741 |
| 2020/0304741 | A1* | 9/2020 | Dielacher | H04N 5/36965 |
| 2021/0104569 | A1* | 4/2021 | Kwak | H01L 27/1464 |

(Continued)

FOREIGN PATENT DOCUMENTS

| | | |
|---|---|---|
| JP | 2018-117117 A | 7/2018 |
| KR | 10-2017-0040124 A | 4/2017 |

OTHER PUBLICATIONS

Hansard, M., Lee, S., Choi, O., &Horaud, R. P. (2012). Time-of-flight cameras : principles, methods and applications. Springer Science & Business Media.

*Primary Examiner* — Marly S Camargo
(74) *Attorney, Agent, or Firm* — Perkins Coie LLP

(57) ABSTRACT

A pixel included in an image sensor may include: a first control node and a second control node, each configured to receive control signals and generate a hole current in a substrate; and a first detection node and a second detection node, configured to capture electrons which are generated by incident light in the substrate and move by the hole current. Each of the first and second control nodes has a shape including a first surface and second surfaces connected to the first surface and the first surfaces of the first control node and the second control node are disposed to face each other, and an area of the first surface is larger than an area of any one of the second surfaces.

20 Claims, 20 Drawing Sheets

(56) References Cited

U.S. PATENT DOCUMENTS

2021/0183919 A1* 6/2021 Kwak .................... H01L 27/146
2021/0288088 A1* 9/2021 Jang .................. H01L 27/14612

* cited by examiner

PIXEL AND IMAGE SENSOR INCLUDING THE SAME

CROSS-REFERENCES TO RELATED APPLICATION

This patent document claims the priority and benefits of Korean application number 10-2020-0027142, filed on Mar. 4, 2020, which is incorporated herein by reference in its entirety.

TECHNICAL FIELD

The technology and implementations disclosed in this patent document generally relate to an image sensor for sensing a distance to a target object.

BACKGROUND

An image sensor is a device for capturing an image using the properties of semiconductor which reacts to light that is incident thereon to produce an image. Recently, with the development of computer industry and communication industry, the demand for an advanced image sensor has been increasing in various electronic devices such as smart phones, digital cameras, video game equipment, devices for use with IOT (Internet of Things), robots, security cameras and medical micro cameras.

The image sensor may be roughly divided into a CCD (Charge Coupled Device) image sensors and CMOS (Complementary Metal Oxide Semiconductor) image sensors. CCD image sensors generates less noise and have better image quality than CMOS image sensors. However, CMOS image sensors have a simpler and more a convenient driving scheme, and thus may be preferred in some applications. CMOS image sensors may integrate a signal processing circuit in a single chip, making it easy to miniaturize the sensors for implementation in a product, with the added benefit of consuming lower power consumption. CMOS image sensors can be fabricated using a CMOS process technology, which results in low manufacturing cost. CMOS image sensing devices have been widely used due to their suitability for implementation in mobile devices.

There have been much development and studies for measuring range and depth by using an image sensor. The demand for the technologies of measuring range and depth are rapidly increases in various fields including security devices, medical devices, vehicles, game consoles, VR/AR and/or mobile devices. The representative technologies include triangulation, ToF (Time of Flight) and interferometry. Among the methods, the ToF method becomes popular because of its wide range of utilization, high processing speed, and cost advantages. The TOF method measures a distance using emitted light and reflected light. The ToF method can be classified into two different types, i.e., a direct method and an indirect method, depending on whether it is a round-trip time or the phase difference that determines the distance. The direct method measures a distance by calculating a round trip time and the indirect method measures a distance using a phase difference. Since the direct method is suitable for measuring a long distance, the direct method is generally used in vehicles. The indirect method is suitable for measuring a short distance and thus is generally used for game devices or mobile cameras that are associated with shorter distances and require faster processing speed. As compared to the direct type ToF systems, the indirect method have several advantages, including having simpler circuitry, low memory requirement, and a relatively low cost.

A CAPD (Current-Assisted Photonic Demodulator) is one type of pixel circuitry used in an indirect ToF sensor. In CAPD, electrons are generated in a pixel circuit by majority current that is created through an application of a substrate voltage, and the generated electrons are detected by using a potential difference of an electric field. Since the majority current is used, the CAPD can rapidly detect electrons. Furthermore, the CAPD has an excellent efficiency by detecting the electrons which are disposed in deep locations.

SUMMARY

Various embodiments of the disclosed technology are related to an image sensor capable of effectively performing a high-speed distance sensing operation.

In an embodiment, a pixel included in an image sensor may include: a first control node and a second control node, each configured to receive control signals and generate a hole current in a substrate in response to the control signals; and a first detection node and a second detection node that are arranged to correspond to the first control node and the second control node, respectively, and configured to capture electrons which are generated by incident light in the substrate and move by the hole current, wherein each of the first and second control nodes has a shape including a first surface and second surfaces connected to the first surface and the first surfaces of the first control node and the second control node are disposed to face each other, and an area of the first surface is larger than an area of any one of the second surfaces.

In another aspect, an image sensor comprising pixels that detect incident light to produce pixel signals indicative of an image carried by the incident light, wherein the pixels include a first CAPD (Current-Assisted Photonic Demodulator) pixel and a second CAPD pixel, which are arranged adjacent to each other. A control node of the first CAPD pixel may include a first surface facing another control node of the first CAPD pixel and a second surface facing a control node of the second CAPD pixel, and the first surface may have a larger area than an area of the second surface.

In accordance with the present embodiments, the image sensor can improve the transmission efficiency of a hole current flowing through a unit pixel while minimizing crosstalk with an adjacent pixel and power consumption of the entire pixel array. Therefore, although the size of a CAPD pixel is reduced, the image sensor can be designed to have the optimal performance.

DETAILED DESCRIPTION

Hereafter, various embodiments will be described with reference to the accompanying drawings. However, it should be understood that the present disclosure is not limited to specific embodiments, but includes various modifications, equivalents and/or alternatives of the embodiments.

Figure 1:
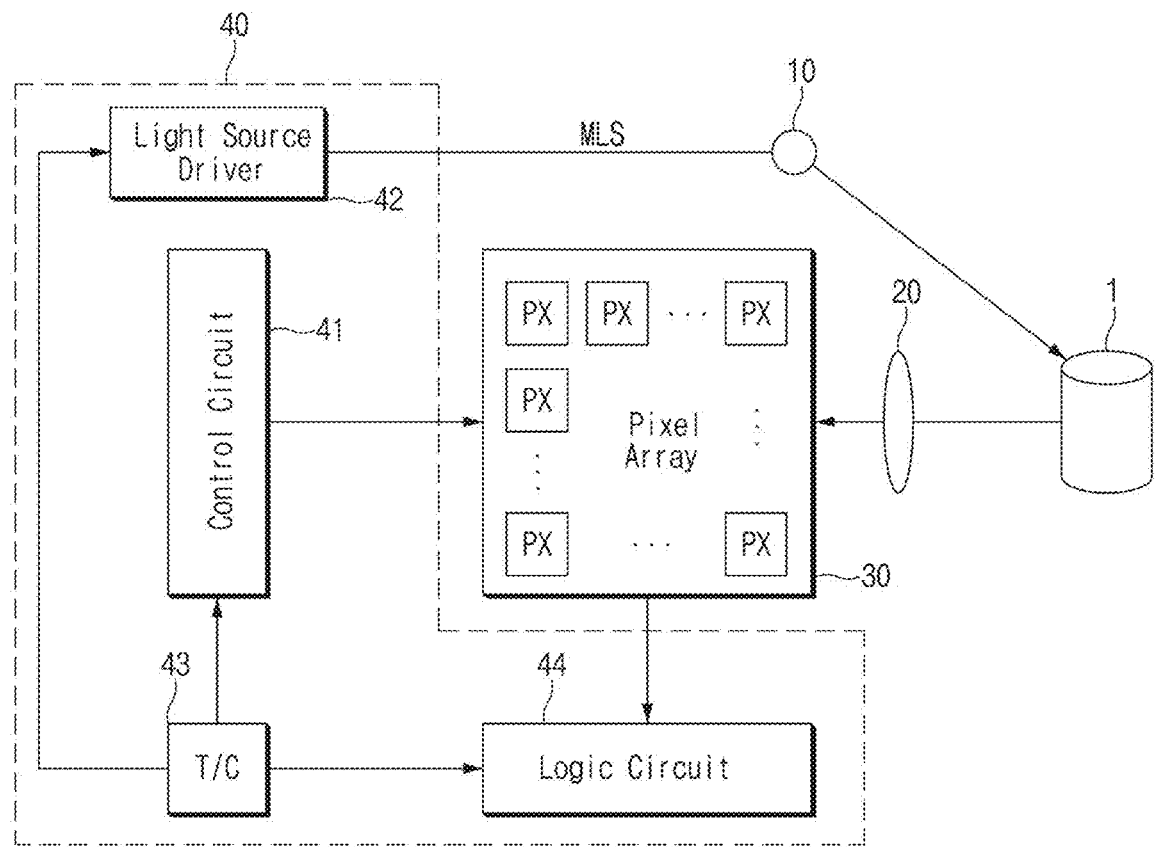
FIG. 1 is a configuration diagram schematically illustrating a configuration of an image sensor in accordance with embodiments.

FIG. 1 is a configuration diagram schematically illustrating a configuration of an image sensor in accordance with embodiments.

Referring to FIG. 1, the image sensor may measure a distance to a target object 1 using a ToF (Time of Flight) method. Such an image sensor may include a light source 10, a lens module 20, a pixel array 30 and a control block 40.

The light source 10 emits light onto the target object 1 in response to a clock signal MLS (modulated light signal) from the control block 40. The light source 10 may be an LD (laser Diode) or LED (Light Emitting Diode) which emits a specific wavelength of light (for example, near-infrared light, infrared light or visible light), NIR (Near Infrared Laser), a point light source, a white lamp, a monochromatic light source having monochromators combined therein, or a combination of other laser light sources. For example, the light source 10 may emit infrared light having a wavelength of 800 nm to 1,000 nm. The light emitted from the light source 10 may be light which is modulated at a predetermined frequency. FIG. 1 illustrates only one light source 10, for convenience of description. However, a plurality of light sources may be arranged around the lens module 20.

The lens module 20 may collect light reflected from the target object 1 and focus the collected light on pixels PX of the pixel array 30. For example, the lens module 20 may include a focusing lens with a glass or plastic surface or a cylindrical optical element. The lens module 20 may include a plurality of lenses aligned with an optical axis.

The pixel array 30 may include a plurality of unit pixels PX which are successively arranged in a 2D matrix structure, for example, a plurality of unit pixels PX which are successively arranged in column and row directions. The unit pixels PX may be formed on a semiconductor substrate, and each of the unit pixels PX may convert light, incident through the lens module 20, into an electrical signal corresponding to the intensity of the light, and output the electrical signal as a pixel signal. At this time, the pixel signal may be a signal which does not indicate the color of the target object 1, but indicates the distance to the target object 1. Each of the unit pixels PX may be a CAPD (Current-Assisted Photonic Demodulator) pixel. The detailed structure and operation of the unit pixel PX will be described below with reference to FIG. 2A and the followings.

The control block 40 may control the light source 10 to emit light onto the target object 1, and drive the unit pixels PX of the pixel array 30 to process pixel signals corresponding to light reflected from the target object 1, thereby measuring the distance to the surface of the target object 1.

The control block 40 may include a control circuit 41, a light source driver 42, a timing controller 43 and a logic circuit 44.

The control circuit 41 may drive the unit pixels PX of the pixel array 30 in response to a timing signal outputted from the timing controller 43. For example, the control circuit 41 may generate a control signal capable of selecting and controlling one or more row lines among a plurality of row lines. Such a control signal may include a demodulation control signal for generating a hole current within a substrate, a reset signal for controlling a reset transistor, a transmission signal for controlling transfer of photoelectric charges accumulated in a detection node, and a selection signal for controlling a selection transistor. FIG. 1 illustrates that the control circuit 41 is disposed in the column direction (or vertical direction) of the pixel array 30. According to an embodiment, however, at least a part of the control circuit 41 (for example, a circuit for generating the demodulation control signal) may be disposed to be elongated in the row direction (or horizontal direction) of the pixel array 30.

The light source driver 42 may generate the clock signal MLS capable of driving the light source 10, under control of the timing controller 43. The clock signal MLS may be a signal which is modulated at a predetermined frequency.

The timing controller 43 may generate a timing signal for controlling the operations of the control circuit 41, the light source driver 42 and the logic circuit 44.

The logic circuit 44 may generate pixel data in the form of digital signals by processing pixel signals outputted from the pixel array 30, under control of the timing controller 43. For this operation, the logic circuit 44 may include a CDS (Correlated Double Sampler) for performing correlated double sampling on the pixel signals outputted from the pixel array 30. The logic circuit 44 may include an analog-digital converter for converting the output signals from the CDS into digital signals. Furthermore, the logic circuit 44 may include a buffer circuit which temporarily stores pixel data outputted from the analog-digital converter and outputs the pixel data to the outside under control of the timing controller 43. As the pixel array 30 is composed of CAPD pixels, two column lines per one column of the pixel array 30 may be provided to transfer pixel signals, and components for processing pixel signals outputted from the column lines may also be provided for the respective column lines.

The light source 10 may emit modulated light, modulated at a predetermined frequency, toward a scene to be captured by the image sensor, and the image sensor may sense the modulated light (i.e. incident light) reflected from target objects 1 within the scene, and generate depth information for each of the unit pixels PX. Between the modulated light and the incident light, time delay is present due to the distance between the image sensor and the target object 1. Such time delay appears as a phase difference between a signal generated by the image sensor and the clock signal MLS for controlling the light source 10. The image processor (not illustrated) may generate a depth image containing depth information for each of the unit pixels PX by calculating a phase difference which occurs in a signal outputted from the image sensor.

Figure 2A:
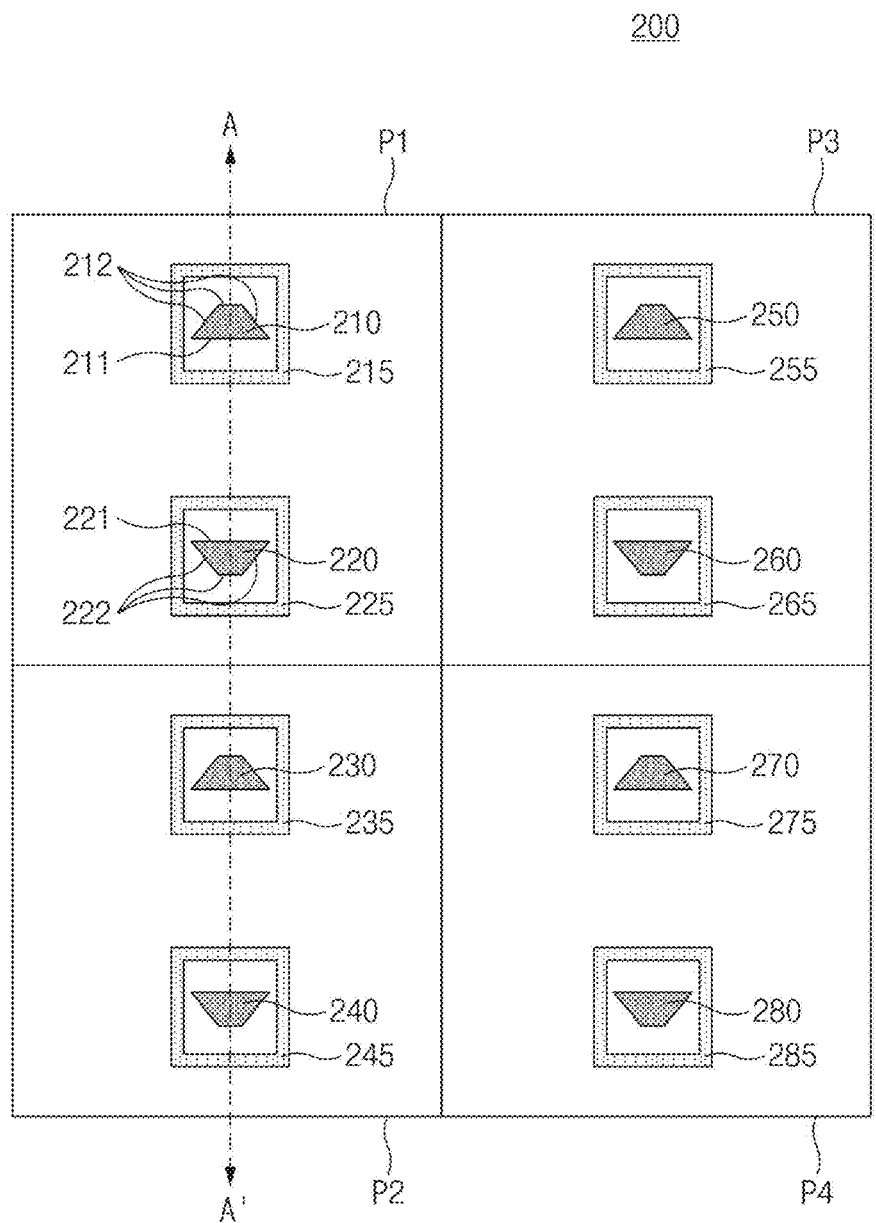
FIG. 2A is a plan view illustrating an embodiment of a pixel included in a pixel array illustrated in FIG. 1.
Figure 2B:
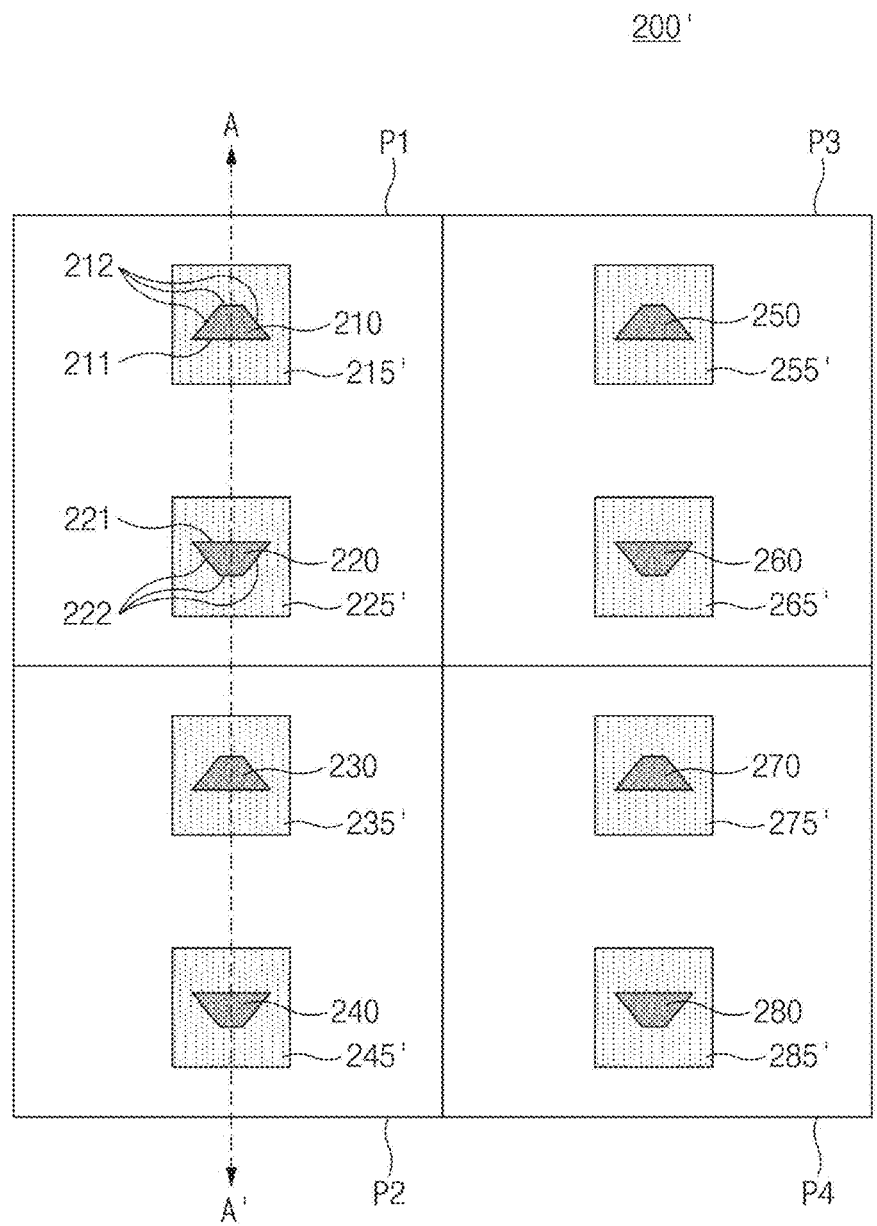
FIG. 2B is a plan view illustrating another embodiment of a detection node included in the pixel illustrated in FIG. 2A.
Figure 3A:
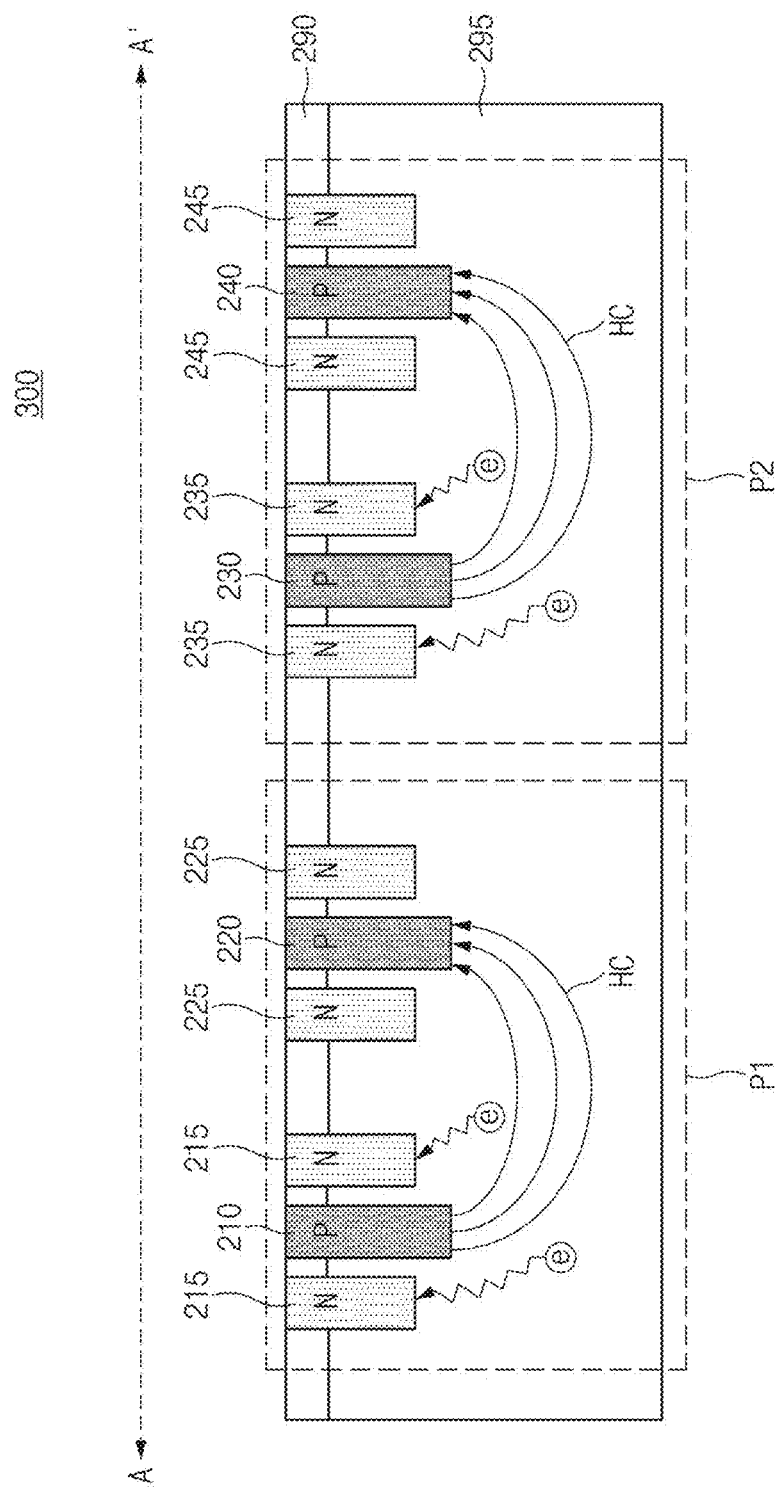
FIG. 3A is a cross-sectional view of the pixel illustrated in FIG. 2A.
Figure 3B:
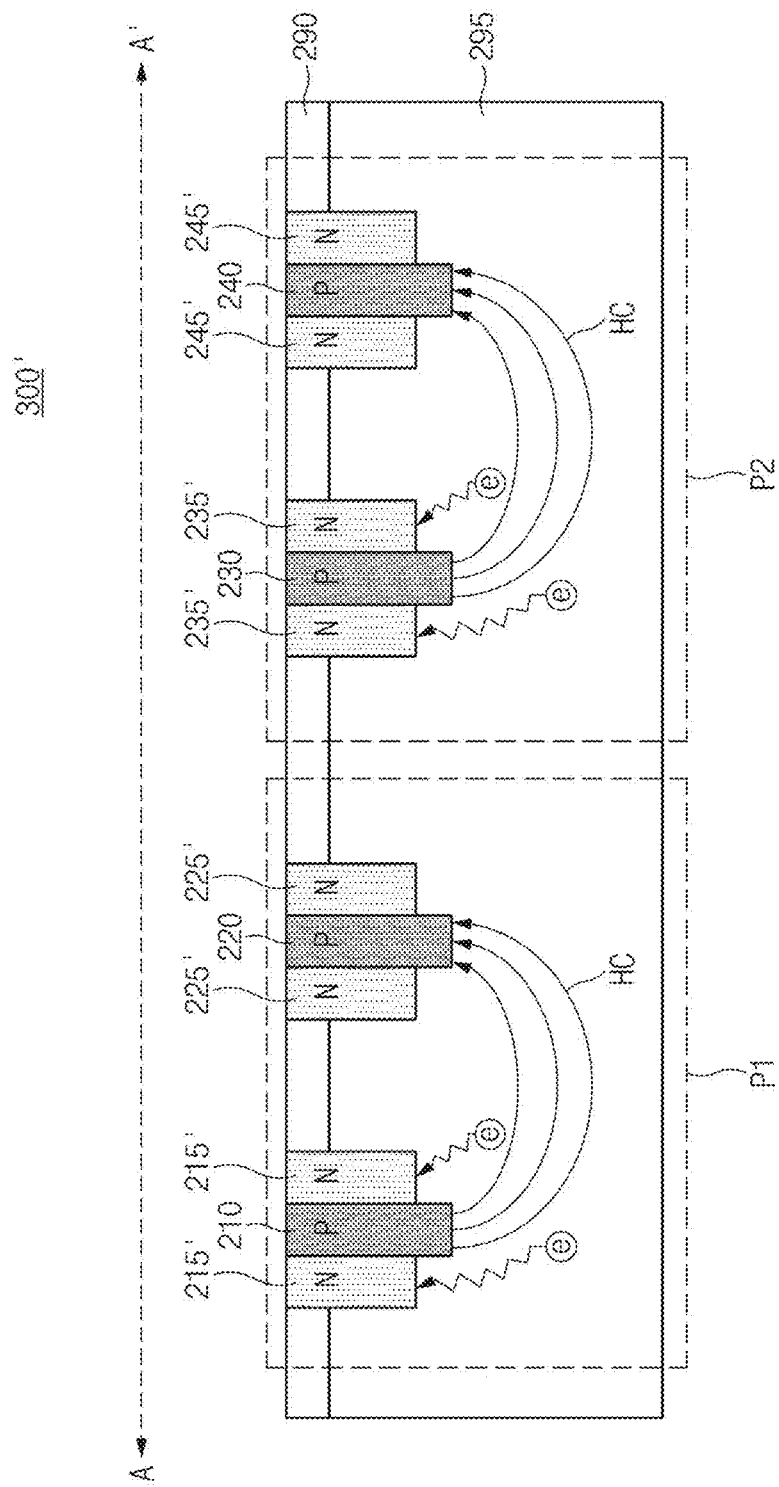
FIG. 3B is a cross-sectional view of the pixel illustrated in FIG. 2B.

FIG. 2A is a plan view illustrating an embodiment of a pixel included in a pixel array illustrated in FIG. 1. FIG. 2B is a plan view illustrating another embodiment of a detection node included in the pixel illustrated in FIG. 2A. FIG. 3A is a cross-sectional view of the pixel illustrated in FIG. 2A. FIG. 3B is a cross-sectional view of the pixel illustrated in FIG. 2B.

FIG. 2A illustrates a plan view 200 including first to fourth pixels P1 to P4 which are arranged in a 2×2 matrix so as to be adjacent to one another, and the pixel array 30 may include the first to fourth pixels P1 to P4 that are arranged in a matrix shape. Each of the first to fourth pixels P1 to P4 has a substantially similar structure.

The first pixel P1 may include first and second control nodes 210 and 220 and first and second detection nodes 215 and 225. The first control node 210 and the first detection node 215 may constitute a first demodulation node (or first tap), and the second control node 220 and the second detection node 225 may constitute a second demodulation node (or second tap). FIG. 2A illustrates that the first demodulation node including the first control node 210 and the first detection node 215 and the second demodulation node including the second control node 220 and the second detection node 225 are arranged within the first pixel P1 in a line that is parallel to the column direction of the pixel array 30. However, the disclosed technology is not limited thereto and other implementations are also possible. For example, the first demodulation node including the first control node 210 and the first detection node 215 and the second demodulation node including the second control node 220 and the second detection node 225 may be arranged in a line that is parallel to the row direction of the pixel array 30.

The first detection node 215 may be disposed to surround the first control node 210, and the second detection node 225 may be disposed to surround the second control node 220. By being arranged to surround the first and second control nodes 210 and 220, the first and second detection nodes 215 and 225 can more easily capture signal carriers which migrate along hole currents formed by the first and second control nodes 210 and 220. In some implementations, the first and second detection nodes 215 and 225 may surround only parts of the first and second control nodes 210 and 220, respectively instead of completely surrounding the first and second control nodes 210 and 220, respectively. In this case, at least parts of the first and second control nodes 210 and 220 are configured as open instead of being provided in a closed shape.

The second pixel P2 may include first and second control nodes 230 and 240 and first and second detection nodes 235 and 245. The third pixel P3 may include first and second control nodes 250 and 260 and first and second detection nodes 255 and 265. The fourth pixel P4 may include first and second control nodes 270 and 280 and first and second detection nodes 275 and 285.

The first control nodes 230, 250 and 270 and the first detection nodes 235, 255 and 275, included in the second to fourth pixels P2 to P4, may constitute first demodulation nodes (or first taps) of the second to fourth pixels P2 to P4, respectively, and the second control nodes 240, 260 and 280 and the second detection nodes 245, 265 and 285, included in the second to fourth pixels P2 to P4, may constitute second demodulation nodes (or second taps) of the second to fourth pixels P2 to P4, respectively. Since the second to fourth pixels P2 to P4 may have a structure corresponding to the first pixel P1, the same descriptions thereof will be omitted herein.

Each of the first to fourth pixels P1 to P4 may further include a wiring line, a floating diffusion and one or more transistors for applying a driving signal to the corresponding pixel, generating and reading pixel signals from the corresponding pixel. In FIG. 2A, however, the wiring line, the floating diffusion and the one or more transistors are omitted, for convenience of description.

FIG. 3A illustrates a cross-section 300 taken along line A-A' of FIG. 2A.

First, the first pixel P1 will be described. In the first pixel P1, the first detection node 215 may be disposed on the left and right sides of the first control node 210. Furthermore, the second detection node 225 may be disposed on the left and right sides of the second control node 220.

The first and second control nodes 210 and 220 and the first and second detection nodes 215 and 225 may be formed in a substrate 295. The substrate 295 may be a P-type semiconductor substrate. As illustrated in FIG. 3A, the first and second control nodes 210 and 220 may be P-type impurity regions, and the first and second detection nodes 215 and 225 may be N-type impurity regions. In some implementations, each of the first and second control nodes 210 and 220 and the first and second detection nodes 215 and 225 may include a plurality of impurity layers having different doping concentrations. For example, each of the first and second control nodes 210 and 220 may have a structure in which a P+ region with a relatively high impurity concentration and a P– region with a relatively low impurity concentration are sequentially stacked from the top surface of the substrate 295. For example, each of the first and second detection nodes 215 and 225 may have a structure in which an N+ region with a relatively high impurity concentration and an N– region with a relatively low impurity concentration are sequentially stacked from the top surface of the substrate 295.

The depth of each of the first and second control nodes 210 and 220 from the top surface of the substrate 295 may be larger than the depth of each of the first and second detection nodes 215 and 225 from the top surface of the substrate 295. Through such a structure, a hole current HC between the first and second control nodes 210 and 220 may more easily flow without being disturbed by the first and second detection nodes 215 and 225.

The first demodulation nodes and the second demodulation nodes, which are included in the first pixel P1 and the second pixel P2, respectively, may be physically isolated by an insulating layer 290. Furthermore, the first control node 210 and the first detection node 215 may also be physically isolated by the insulating layer 290, and the second control node 220 and the second detection node 225 may also be physically isolated by the insulating layer 290. The insulating layer 290 may be an oxide layer, but the disclosed technology is not limited thereto. In some implementations, the insulating layer 290 may be formed through a process of forming a trench in the substrate 295 using an STI (Shallow Trench Isolation) process and gap-filling the trench with an insulating material.

FIG. 2B illustrates a plan view 200' including first to fourth pixels P1 to P4 including detection nodes 215', 225', 235', 245', 255', 265', 275' and 285' having different shapes from the detection nodes 215, 225, 235, 245, 255, 265, 275 and 285 illustrated in FIG. 2A, and FIG. 3B illustrates a cross-sectional view 300' of some of the detection nodes 215', 225', 235', 245', 255', 265', 275' and 285'. unlike the implementation as shown in FIGS. 2A and 3A, there is no separate insulating layer disposed between the first control node 210 and the first detection node 215' and between the second control node 220 and the second detection node 225'. The first detection node 215' and the second detection node 225' may be formed to surround the first control node 210 and the second control node 220, respectively, while abutting on the first control node 210 and the second control node 220, respectively. In this case, the first control node 210 and the first detection node 215' may be physically isolated only by junction isolation, and the second control node 220 and the second detection node 225' may also be physically isolated only by junction isolation. Therefore, while the areas of the first and second detection nodes 215' and 225' are increased, the first and second detection nodes 215' and 225' may be disposed close to the first and second control nodes 210 and 220, respectively, which makes it possible to secure the detection performance of the first and second detection nodes 215' and 225'.

Referring to FIG. 3A, the image sensor may be an FSI (Front-Side Illumination)-type image sensor which receives incident light through a front surface of the substrate 295 (top surface in FIG. 3A). In some implementations, the image sensor may be a BSI (Back-Side Illumination)-type image sensor which receives incident light through a back surface of the substrate 295 (bottom surface in FIG. 3A).

The first and second control nodes 210 and 220 may receive first and second demodulation control signals, respectively, from the control circuit 41. A potential difference between the first and second demodulation control signals generates an electric field (or hole current) to control a flow of signal carrier which is generated in the substrate 295 in response to incident light.

The first and second detection nodes 215 and 225 may perform a function of capturing a signal carrier, and be coupled to first and second floating diffusions having specific capacitance, respectively. Each of the first and second floating diffusions may be coupled to a reset transistor for resetting the corresponding floating diffusion and a source follower for generating an electrical signal according to the potential of the corresponding floating diffusion. The source follower may be coupled to a selection transistor for outputting the electrical signal, outputted from the source follower, to a column line. Thus, signals corresponding to the signal carriers captured by the first and second detection nodes 215 and 225 may be outputted to independent column lines, respectively. The reset control signal for controlling the reset transistor and the selection control signal for controlling the selection transistor may be provided from the control circuit 41.

Hereafter, the operation of the first pixel P1 will be described in more detail. The operations occur during a first section in which the first demodulation control signal applied to the first control node 210 has a higher voltage than the second demodulation control signal applied to the second control node 220 and second section in which the first demodulation control signal applied to the first control node 210 has a lower voltage than the second demodulation control signal applied to the second control node 220.

In the first section, the substrate 295 may receive incident light and photoelectrically convert the incident light. The incident light may be photoelectrically converted to generate electron hole pairs in the substrate 295 according to the intensity of the incident light. At this time, the control circuit 41 may apply a first demodulation control signal to the first control node 210, and apply a second demodulation control signal to the second control node 220. Here, the first demodulation control signal may have a higher voltage than the second demodulation control signal. For example, the voltage of the first demodulation control signal may be 1.2V, and the voltage of the second demodulation control signal may be 0V.

Due to a voltage difference between the first and second demodulation control signals, an electric field may be generated between the first and second control nodes 210 and 220, and a hole current HC may flow from the first control node 210 to the second control node 220. Holes within the substrate 295 may migrate toward the second control node 220, and electrons within the substrate 295 may migrate toward the first control node 210.

Thus, electrons may be generated in the substrate 295 in response to the intensity of incident light, and migrate toward the first control node 210 so as to be captured by the first detection node 215 adjacent to the first control node 210. Therefore, the electrons within the substrate 295 may be used as signal carriers for detecting the intensity of incident light.

The electrons captured by the first detection node 215 may be accumulated in the first floating diffusion and change the potential of the first floating diffusion, and the source follower and the selection transistor may output an electrical signal corresponding to the potential of the first floating diffusion to a column line. Such an electrical signal may be an image signal, and generated as image data through CDS and analog-digital conversion with a reference signal which is an electrical signal corresponding to the potential of the first floating diffusion after the first floating diffusion is reset by the reset transistor.

In the second section after the first section, the substrate 295 may receive incident light and photoelectrically convert the incident light. The incident light may be photoelectrically converted to generate electron hole pairs in the substrate 295 according to the intensity of the incident light. At this time, the control circuit 41 may apply the first demodulation control signal to the first control node 210, and apply the second demodulation control signal to the second control node 220. Here, the first demodulation control signal may have a lower voltage than the second demodulation control signal. For example, the voltage of the first demodulation control signal may be 0V, and the voltage of the second demodulation control signal may be 1.2V.

Due to a voltage difference between the first and second demodulation control signals, an electric field may be generated between the first and second control nodes 210 and 220, and a current may flow from the second control node 220 to the first control node 210. Thus, holes within the substrate 295 may migrate toward the first control node 210, and electrons within the substrate 295 may migrate toward the second control node 220.

Thus, electrons may be generated in the substrate 295 in response to the intensity of incident light, and migrate toward the second control node 220 so as to be captured by the second detection node 225 adjacent to the second control node 220. Therefore, the electrons within the substrate 295 may be used as signal carriers for detecting the intensity of the incident light.

The electrons captured by the second detection node 225 may be accumulated in the second floating diffusion and change the potential of the second floating diffusion, and the source follower and the selection transistor may output an electrical signal corresponding to the potential of the second floating diffusion to a column line. Such an electrical signal may be an image signal, and generated as image data through CDS and analog-digital conversion with a reference signal which is an electrical signal corresponding to the potential of the second floating diffusion after the second floating diffusion is reset by the reset transistor.

An image processor (not illustrated) may calculate a phase difference by performing an operation on the image data acquired in the first section and the image data acquired in the second section, calculate depth information, obtain a depth information indicating the distance to the target object 1 based on a phase difference of a corresponding pixel, and generate a depth image including the depth information of the corresponding pixel.

Since the structure and operation of the second pixel P2 are substantially the same as those of the first pixel P1, the detailed descriptions thereof are omitted herein.

The first and second pixels P1 and P2 are disposed adjacent to each other. As the same first demodulation control signal is applied to the first control node 210 of the first pixel P1 and the first control node 230 of the second pixel P2, an electric field can be formed between control nodes that are included in different pixels. For example, the electric field may be formed not only between the first control node 210 and the second control node 220 to which the second demodulation control signal is applied, but also between the first control node 230 and the second control node 220. Thus, a hole current is likely to be generated between the first control node 230 and the second control node 220. However, the hole current between the first control node 230 and the second control node 220 may induce electrons, generated around the boundary between the first and second pixels P1 and P2, to the first detection node 235, thereby causing noise (or crosstalk). Furthermore, an undesired hole current may be generated to increase power consumption of the image sensor.

Referring back to FIG. 2A, the first control node 210 of the first pixel P1 may have a polygonal shape in which the horizontal length of a first surface 211 facing the second control node 220 of the first pixel P1 is larger than the horizontal length of any one of a plurality of second surfaces 212 which do not face the second control node 220 of the first pixel P1. The first surface 211 of the first control node 210 is closer to the second control node 220 as compared to second surfaces 212 of the first control node 210. FIG. 2A illustrates that the first control node 210 has a trapezoidal shape, but the disclosed technology is not limited thereto and other implementations are also possible. For example, the first control node 210 may have a triangle shape. In the present embodiment, the horizontal length may indicate the length of a specific surface on the plan view.

The second control node 220 of the first pixel P1 may have a polygonal shape in which the horizontal length of a first surface 221 facing the first control node 210 of the first pixel P1 is larger than the horizontal length of any one of a plurality of second surfaces 222 which do not face the first control node 210 of the first pixel P1. FIG. 2A illustrates that the second control node 220 has a trapezoidal shape, but the disclosed technology is not limited thereto. For example, the second control node 220 may have a triangle shape.

In the first pixel P1, the first control node 210 and the second control node 220 are disposed to face each other. The first surface 211 of the first control node 210 may be disposed closer to the second control node 220 as compared to second surfaces 212 of the first control node 210. The first surface 221 of the second control node 220 may be disposed to face the first control node 210 as compared to second surfaces 222 of the second control node 220. The second surfaces 212 and 222 of the first control node 210 and the second control node 220 may be directly/indirectly connected to the corresponding first surfaces 211 and 221.

The first control nodes 230, 250 and 270 and the second control nodes 240, 260 and 280 of the second to fourth pixels P2 to P4 may have shapes and disposition directions corresponding to those of the first control node 210 and the second control node 220 of the first pixel P1.

The hole current flowing between two control nodes to which different voltages are applied increases, as (1) the potential difference between the control nodes is increased, (2) the distance between the control nodes is decreased, and/or (3) the areas of surfaces of the control nodes that face each other are increased. Thus, at least one of the conditions (1) to (3) are satisfied, the hole current flowing between the two control nodes increases. On the other hand, the hole current flowing between the control nodes to which different voltages are applied decreases, as (1) the potential difference between the control nodes is decreased, (2) the distance between the control nodes is increased, and/or (3) the areas of surfaces of the control nodes that face each other are decreased. Thus, at least one of the conditions (1) to (3) are satisfied, the hole current flowing between the two control nodes decreases. The hole current may be decided by the potential difference between the control nodes and the resistance between the control nodes. The resistance between the control nodes increases, as (1) the distance between the control nodes is increased and/or (2) the areas of the surfaces of the control nodes that facing each other are decreased. In the present embodiment, it is assumed that a potential difference between the control nodes to which different voltages are applied is constant.

Therefore, among the magnitudes of hole currents between the second control node 220 and one of the control nodes 210, 230, 250 and 270 around the second control node 220, the hole current flowing between the second control node 220 and the first control node 210 has the largest magnitude since the first control node 210 is the closest to the second control node 220 and its surface facing the second control node 220 has the largest area. The hole currents between the second control node 220 and one of the first control nodes 230, 250 and 270 have relatively small magnitude since the first control nodes 230, 250 and 270 is located relatively remote from the second control node 220 and their surfaces facing the second control node 220, respectively, have relatively narrow or smaller areas.

Therefore, crosstalk between the pixels adjacent to each other can be reduced, and unnecessary power consumption can be reduced.

When the first control nodes 210, 230, 250 and 270 and the second control nodes 220, 240, 260 and 280 have a circular shape or square shape, the surface of the second control node 220 facing the first control node 230 may have horizontal length equal or similar to that of the surface of the second control node 220 facing the first control node 210. In this case, as the hole currents flowing between the second control node 220 and the first control node 230 increase, the crosstalk between the adjacent pixels may be increased, and unnecessary power consumption may be increased.

Figure 4A:
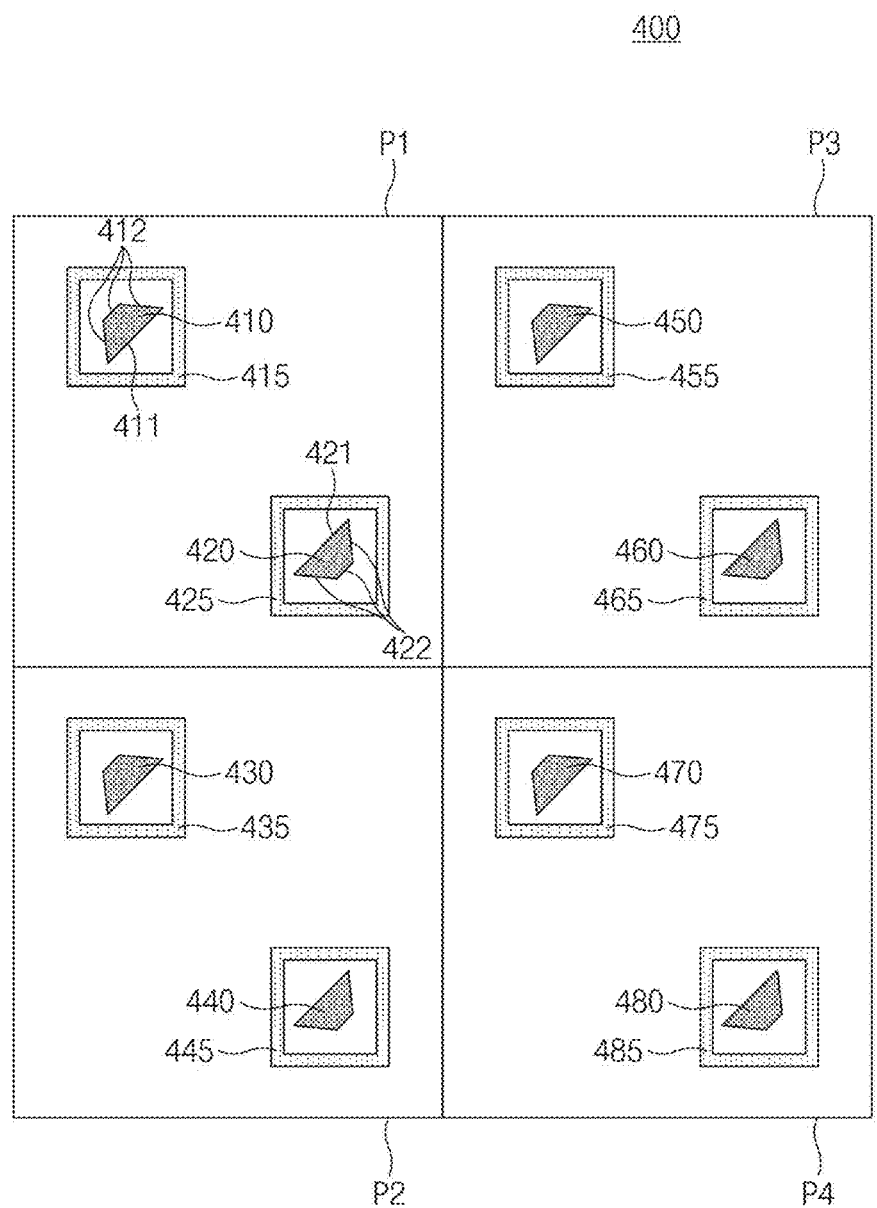
FIG. 4A is a plan view illustrating another embodiment of the pixel included in the pixel array illustrated in FIG. 1.

FIG. 4A is a plan view illustrating another embodiment of the pixel included in the pixel array illustrated in FIG. 1.

FIG. 4A illustrates a plan view 400 including first to fourth pixels P1 to P4 which are arranged in a 2×2 matrix so as to be adjacent to one another, and the pixel array 30 may have a structure in which substantially the same pixels as the first to fourth pixels P1 to P4 are arranged in a matrix shape.

The first to fourth pixels P1 to P4 of FIG. 4A are configured and operated in substantially the same manner as the first to fourth pixels P1 to P4 of FIG. 2A, except the shapes and positions of the first and second demodulation nodes. Therefore, the following descriptions will be focused on differences from FIG. 2A.

First, the first pixel P1 will be described. In the first pixel P1, a first demodulation node including a first control node 410 and a first detection node 415 and a second demodulation node including a second control node 420 and a second detection node 425 may be disposed in a diagonal direction of the first pixel P1. FIG. 4A illustrates that the first demodulation node is disposed at the left top of the first pixel P1, and the second demodulation node is disposed at the right bottom of the first pixel P1. However, the present embodiment is not limited thereto and other implementations are also possible. For example, the first demodulation node including a first control node 410 and a first detection node 415 may be disposed at the left bottom of the first pixel P1, and the second demodulation node including a second control node 420 and a second detection node 425 may be disposed at the right top of the first pixel P1.

Similarly, first and second demodulation nodes included in each of the second to fourth pixels P2 to P4 may be disposed similarly to the disposition of the first pixel P1. For example, the first and second demodulation nodes may be disposed at the left top and the right bottom of the corresponding pixel.

First control nodes 410, 430, 450 and 470 and second control nodes 420, 440, 460 and 480 of the respective pixels P1 to P4 may have the same shapes as the corresponding first control nodes 210, 230, 250 and 270 and the corresponding second control nodes 220, 240, 260 and 280 in FIG. 2A, and be obliquely disposed so that first surfaces of the first and second control nodes belonging to the same pixel face each other. For example, the first surfaces 411 and 421 are formed at a predetermined angle with respect to one side (e.g., top or bottom side) of the unit pixel P1. Such arrangement of the first and second control nodes 410 and 420 are different from the structure in which the first surfaces 211 and 221 of the first and second control nodes 210 and 220 are disposed parallel to one side of the unit pixel P1 as illustrated in FIG. 2A. As shown in FIG. 4A, second surfaces 412 and 422 may be arranged at a predetermined angle with respect to the first surfaces 411 and 421.

According to the diagonal disposition structure illustrated in FIG. 4A, the respective distances between each of the first control nodes 410, 430, 450 and 470 and each of the second control nodes 420, 440, 460 and 480 may be increased, thereby increasing resistance. Therefore, the respective hole currents flowing between each of the first control nodes 410, 430, 450 and 470 and each of the second control nodes 420, 440, 460 and 480 may be decreased to reduce power consumption required for driving the pixel array 30.

Thus, the diagonal disposition structure illustrated in FIG. 4A may not only have the advantages (reduction in power consumption and crosstalk between pixels) of the structure described with reference to FIGS. 2A and 2B, but also reduce the respective hole currents flowing between each of the first control nodes 410, 430, 450 and 470 and each of the second control nodes 420, 440, 460 and 480, thereby further reducing power consumption.

Figure 4B:
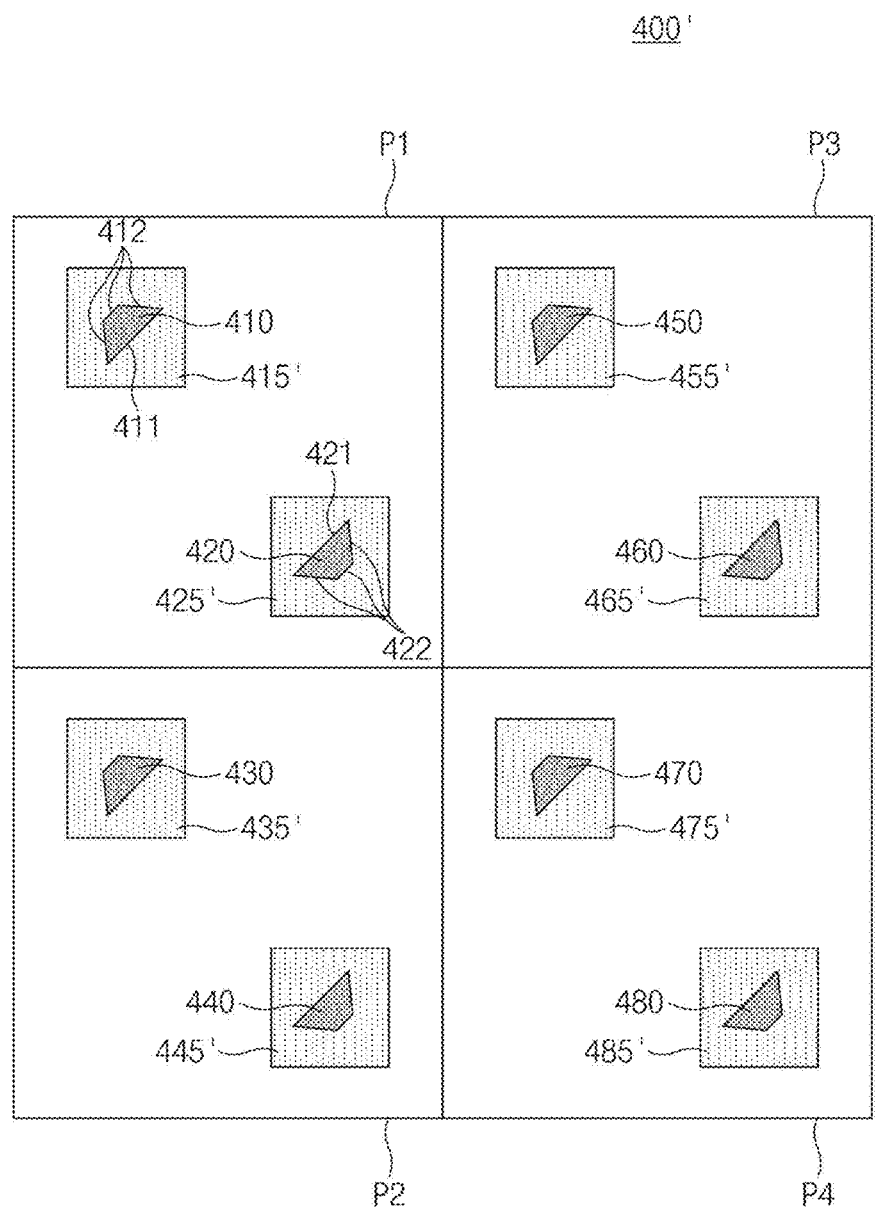
FIG. 4B is a plan view illustrating another embodiment of the detection node included in the pixel illustrated in FIG. 4A.

FIG. 4B is a plan view illustrating another embodiment of the detection node included in the pixel illustrated in FIG. 4A.

FIG. 4B illustrates a plan view 400' including first to fourth pixels P1 to P4 having detection nodes 415', 425', 435', 445', 455', 465', 475' and 485' which have different shapes from the detection nodes 415, 425, 435, 445, 455, 465, 475 and 485 illustrated in FIG. 4A. That is, no separate insulating layer may be disposed between the first control node 410 and the first detection node 415' and between the second control node 420 and the second detection node 425', and the first detection node 415' and the second detection node 425' may be formed to surround the first control node 410 and the second control node 420 while abutting on the first control node 410 and the second control node 420, respectively. In this case, the first control node 410 and the first detection node 415' may be physically isolated only by junction isolation, and the second control node 420 and the second detection node 425' may also be physically isolated only by junction isolation.

Since the first to fourth pixels P1 to P4 of FIG. 4B are configured and operated in substantially the same manner as the first to fourth pixels P1 to P4 of FIG. 4A except the shapes of the first and second detection nodes, the same descriptions will be omitted herein.

Figure 5A:
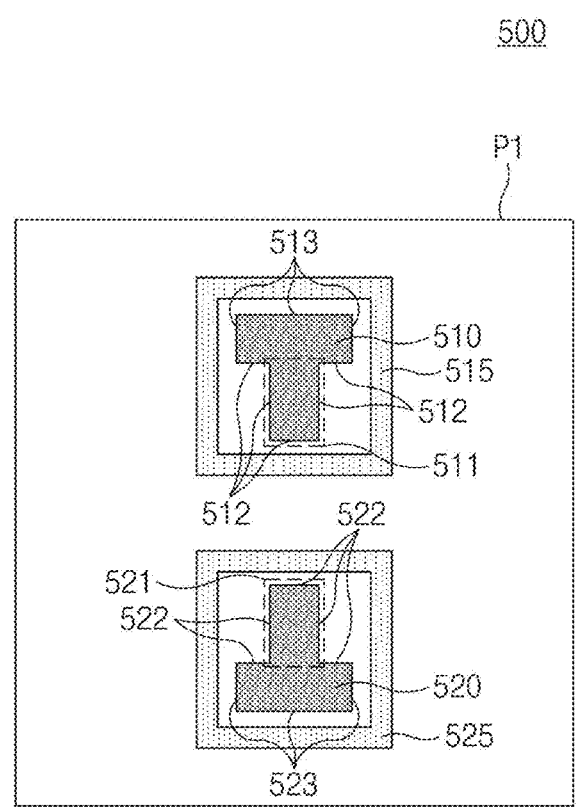
FIG. 5A is a plan view illustrating another embodiment of a control node included in the pixel illustrated in FIG. 2A.

FIG. 5A is a plan view illustrating another embodiment of the control node included in the pixel illustrated in FIG. 2A.

FIG. 5A illustrates another embodiment 500 of the first and second control nodes included in the first pixel P1 of FIG. 2A. Since a first pixel P1 of FIG. 5A is configured and operated in substantially the same manner as the first pixel P1 of FIG. 2A except the shape of first and second control nodes 510 and 520, the following descriptions will be focused on differences from FIG. 2A, in order to avoid repeating same descriptions. Furthermore, only the first pixel P1 is described for convenience of description, but it is obvious that substantially the same structure may be applied to the other pixels.

The first and second control nodes 510 and 520 may include protrusions 511 and 521, respectively, which protrude toward each other.

Due to the protrusions 511 and 521, the centers of the first and second control nodes 510 and 520 may become close to each other. Thus, the distance between the first and second control nodes 510 and 520 may be decreased to reduce the resistance between the first and second control nodes 510 and 520.

A control node may have only one first surface facing the other control node or multiple first surfaces facing the other control node. In FIG. 2A, the first surface may indicate a surface disposed in the region where the first and second control nodes included in the same pixel face each other. When any control node has a plurality of surfaces that face the other control node, there exist connecting surfaces that connect the plurality of the surfaces in the region where the control nodes face each other. In the example of FIG. 5A, each of the first surfaces 512 and 522 of the first and second control nodes 510 and 520 may include three surfaces facing the other control node and connecting surfaces connecting the three surfaces facing the other control node (for example, the left and right side surfaces of the protrusions 511 and 521 of FIG. 5A). Furthermore, a plurality of second surfaces 513 and 523 of the first and second control nodes 510 and 520 may indicate surfaces which are directly/indirectly connected to the first surfaces 512 and 522 (for example, the uppermost surface of the first control node 510 in FIG. 5A and surfaces directly connected thereto).

In the example as shown in FIG. 5A, when the protrusions 511 and 521 are present, each of the first control node 510 and the second control node 520 has multiple first surfaces 512 and 522 that include facing surfaces that face the other control node and connecting surfaces that connect the facing surfaces. Due to the protrusions 511 and 521, each of the first control node 510 and the second control node 520 has the first surfaces, disposed in the region where the first and second control nodes 510 and 520 face each other, whose horizontal length is increased as compared to when the protrusions 511 and 521 are not present. Therefore, the resistance between the first and second control nodes 510 and 520 may be reduced. When the protrusions 511 and 521 are not present, each of the first and second control nodes 510 has a single horizontal length of the first surface disposed in the region where the first and second control nodes 510 and 520 face each other, which may correspond to the width of each of the first and second control nodes 510 and 520. When the protrusions 511 and 521 are present, the horizontal length of the first surface disposed in the region where the first and second control nodes 510 and 520 face each other may be further increased as much as the lateral lengths (e.g., left and right lengths) of each of the protrusions 511 and 521. In the present embodiment, each of the protrusions 511 and 521 and structures (for example, isolation control nodes) corresponding to the protrusions 511 and 521 may have the horizontal length that is extended due to the protrusions 511 and 521. For example, the boundary of each of the protrusions 511 and 521 has lengths in the vertical direction and a width in the horizontal direction perpendicular to the vertical direction.

Therefore, as the resistance between the first and second control nodes 510 and 520 is reduced, the hole current flowing between the first and second control nodes 510 and 520 may be increased. As the hole current is concentrated between the first and second control nodes 510 and 520, crosstalk between the adjacent pixels may be reduced.

When the protrusions 511 and 521 are formed to have an excessively large width, the resistance between the first and second control nodes 510 and 520 may be excessively reduced, so that the hole current flowing between the first and second control nodes 510 and 520 may be increased more than necessary. In this case, the power consumption of the pixel array 30 may be increased. Thus, the widths and extension lengths of the protrusions 511 and 521 may be experimentally optimized in consideration of the magnitude of the hole current flowing between the first and second control nodes 510 and 520 and the crosstalk between adjacent pixels.

Figure 5B:
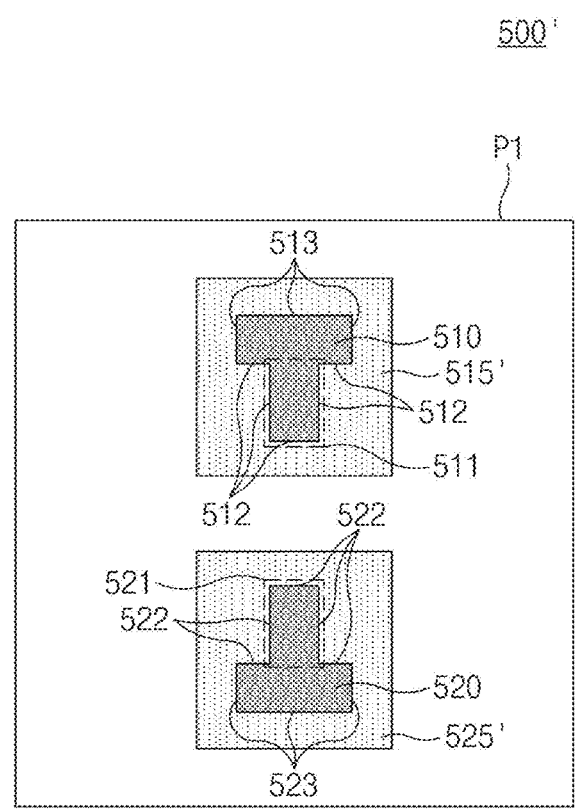
FIG. 5B is a plan view illustrating another embodiment of a detection node included in the pixel illustrated in FIG. 5A.

FIG. 5B is a plan view illustrating another embodiment of the detection node included in the pixel illustrated in FIG. 5A.

FIG. 5B illustrates a plan view 500' including a first pixel P1 having detection nodes 515' and 525' which have a different shape from detection nodes 515 and 525 illustrated in FIG. 5A. That is, no separate insulating layer may be disposed between the first control node 510 and the first detection node 515' and between the second control node 520 and the second detection node 525', and the first detection node 515' and the second detection node 525' may be formed to surround the first control node 510 and the second control node 520 while abutting on the first control node 510 and the second control node 520, respectively. In this case, the first control node 510 and the first detection node 515' may be physically isolated only by junction isolation, and the second control node 520 and the second detection node 525' may also be physically isolated only by junction isolation.

Since the first pixel P1 of FIG. 5B is configured and operated in substantially the same manner as the first pixel P1 of FIG. 5A except the shapes of the first and second detection nodes, the same descriptions will be omitted herein.

Figure 6A:
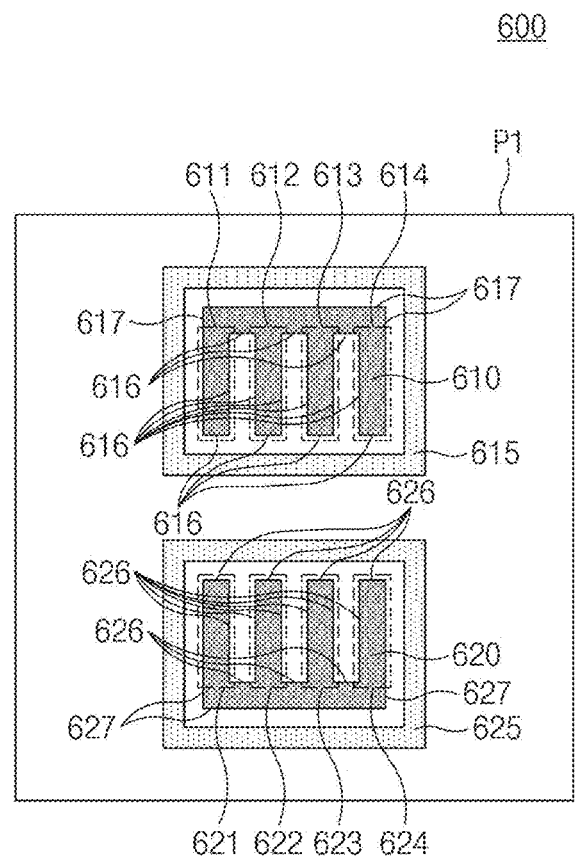
FIG. 6A is a plan view illustrating still another embodiment of the control node included in the pixel illustrated in FIG. 2A.

FIG. 6A is a plan view illustrating still another embodiment of the control node included in the pixel illustrated in FIG. 2A.

FIG. 6A illustrates still another embodiment 600 of the first and second control nodes included in the first pixel P1 of FIG. 2A. Since a first pixel P1 of FIG. 6A is configured and operated in substantially the same manner as the first pixel P1 of FIG. 2A except the shapes of first and second control nodes 610 and 620, the following descriptions will be focused on differences from FIG. 2A, in order to avoid repeating the same descriptions. Furthermore, since the shapes of the first and second control nodes 610 and 620 are similar to the shapes of the first and second control nodes 510 and 520 of FIG. 5A, the following descriptions will be focused on a difference in shape from FIG. 5A. Furthermore, only the first pixel P1 is described for convenience of description, but it is obvious that substantially the same structure may be applied to the other pixels.

Each of the first and second control nodes 610 and 620 may include a plurality of protrusions 611 to 614 and 621 to 624, respectively, which protrude toward the other control node.

The plurality of protrusions 611 to 614 and 621 to 624 may perform a similar function to the protrusions 511 and 521 described with reference to FIG. 5A. Thus, the plurality of protrusions 611 to 614 and 621 to 624 may reduce the distance between the control nodes, and increase the horizontal length of the first surfaces that face the other control node in the same pixel. However, when each of the first and second control nodes 610 and 620 has a plurality of protrusions with a smaller width than when the control node has one protrusion with a large width as illustrated in FIG. 5A, the self resistance of each of the first and second control nodes 610 and 620 may be increased. The self resistance may be decided by the structural complexity of each of the first and second control nodes 610 and 620. For example, when each of the first and second control nodes 610 and 620 has a plurality of protrusions with a total width corresponding to a first width, the self resistance may be increased more than when the control node has one protrusion with a width corresponding to the first width.

Therefore, the resistance between the first and second control nodes 610 and 620 having the plurality of protrusions 611 to 614 and 621 to 624 may be increased more than when one protrusion is present. In this case, the hole current may be reduced, which makes it possible to reduce the power consumption of the pixel array 30.

Each of the first surfaces 616 and 626 of the first and second control nodes 610 and 620 may include facing surfaces facing the other control node and connecting surfaces that connect the facing surfaces facing the other control node (for example, the left and right side surfaces of the protrusions 612 and 613, the right side surface of the protrusion 611 and the left side surface of the protrusion 614). Furthermore, a plurality of second surfaces 617 and 627 of the first and second control nodes 610 and 620 may indicate surfaces which are directly/indirectly connected to the first surfaces 616 and 626 (for example, the uppermost surface of the first control node 610 and surfaces directly connected thereto).

FIG. 6A illustrates that the first and second control nodes 610 and 620 include four protrusions 611 to 614 and four protrusions 621 to 624, respectively. However, the present embodiment is not limited thereto and other implementations are also possible. For example, each of the control nodes may include a random number of protrusions equal to or more than two, and the widths and extension lengths of the protrusions may be experimentally decided.

Furthermore, the widths and extension lengths of the protrusions may be equal to one another, or partially different from one another. For example, the extension lengths and widths of the protrusions may be gradually decreased from the center toward the edge of the control node.

Figure 6B:
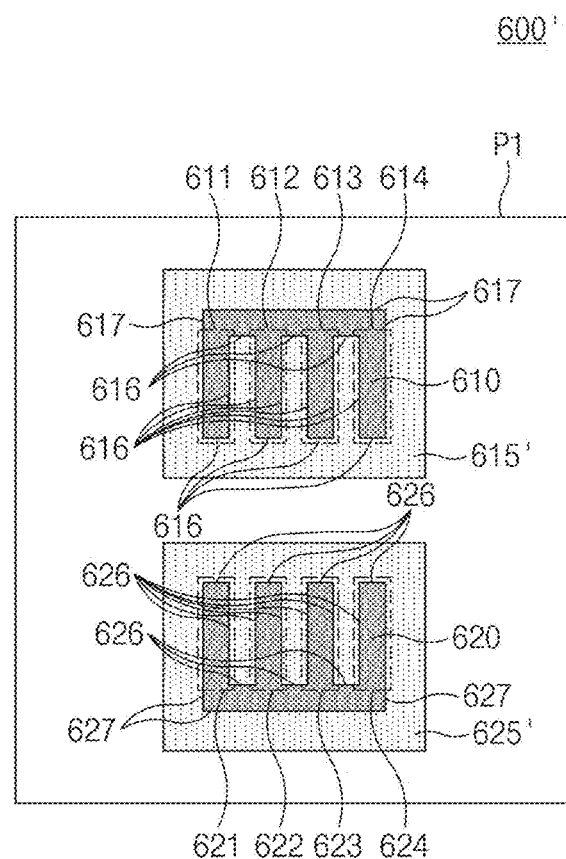
FIG. 6B is a plan view illustrating another embodiment of a detection node included in the pixel illustrated in FIG. 6A.

FIG. 6B is a plan view illustrating another embodiment of the detection node included in the pixel illustrated in FIG. 6A.

FIG. 6B illustrates a plan view 600' including a first pixel P1 having detection nodes 615' and 625' which have different shapes from detection nodes 615 and 625 illustrated in FIG. 6A. That is, no separate insulating layer may be disposed between the first control node 610 and the first detection node 615' and between the second control node 620 and the second detection node 625', and the first detection node 615' and the second detection node 625' may be formed to surround the first control node 610 and the second control node 620 while abutting on the first control node 610 and the second control node 620, respectively. In this case, the first control node 610 and the first detection node 615' may be physically isolated only by junction isolation, and the second control node 620 and the second detection node 625' may also be physically isolated only by junction isolation.

Since the first pixel P1 of FIG. 6B is configured and operated in substantially the same manner as the first pixel P1 of FIG. 6A except the shapes of the first and second detection nodes, the same descriptions will be omitted herein.

Figure 7A:
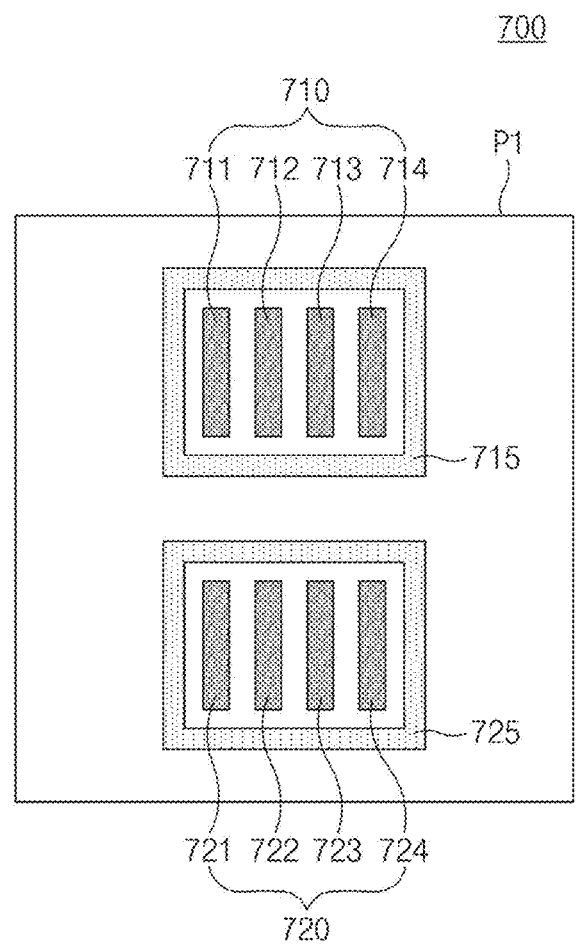
FIG. 7A is a plan view illustrating still another embodiment of the control node included in the pixel illustrated in FIG. 2A.

FIG. 7A is a plan view illustrating still another embodiment of the control node included in the pixel illustrated in FIG. 2A.

FIG. 7A illustrates still another embodiment 700 of the first and second control nodes included in the first pixel P1 of FIG. 2A. Since a first pixel P1 of FIG. 7A is configured and operated in substantially the same manner as the first pixel P1 of FIG. 2A except the shapes of first and second control nodes 710 and 720, the following descriptions will be focused on differences from FIG. 2A, in order to avoid repeating the same descriptions. Furthermore, since the shapes of the first and second control nodes 710 and 720 are similar to the shapes of the first and second control nodes 610 and 620 of FIG. 6A, the following descriptions will be focused on a difference in shape from FIG. 6A. Furthermore, only the first pixel P1 is described for convenience of description, but it is obvious that substantially the same structure may be applied to the other pixels.

The first control node 710 may include a plurality of first isolation control nodes 711 to 714 disposed in a line. The plurality of first isolation control nodes 711 to 714 may be formed in such a shape that the plurality of protrusions 611 to 614 are independently isolated from the first control node 610 described with reference to FIG. 6A. Thus, the plurality of first isolation control nodes 711 to 714 may be formed in such a shape that the connection portion, which is disposed at the tops of the plurality of protrusions 611 to 614 so as to connect the plurality of protrusions 611 to 614, is omitted from the first control node 610. Although the plurality of first isolation control nodes 711 to 714 are physically isolated from one another, the plurality of first isolation control nodes 711 to 714 may receive the same first demodulation control signal.

The second control node 720 may include a plurality of second isolation control nodes 721 to 724 disposed in a line. The plurality of second isolation control nodes 721 to 724 may be formed in such a shape that the plurality of protrusions 621 to 624 are independently isolated from the second control node 620 described with reference to FIG. 6A. In other words, the plurality of second isolation control nodes 721 to 724 may be formed in such a shape that the connection portion, which is disposed at the bottoms of the plurality of protrusions 621 to 624 so as to connect the plurality of protrusions 621 to 624, is omitted from the second control node 620. Although the plurality of second isolation control nodes 721 to 724 are physically isolated from one another, the plurality of second isolation control nodes 714 to 724 may receive the same second demodulation control signal.

Since each of the first and second control nodes 710 and 720 is formed in such a shape that the connection portion connecting the plurality of protrusions 611 to 614 or 621 to 624 is omitted unlike the structure illustrated in FIG. 6A, the horizontal length of a surface facing a control node of an adjacent pixel may be reduced, which makes it possible to reduce crosstalk between the adjacent pixels.

Each of the isolation control nodes 711 to 714 and 721 to 724 may be extended toward the other control node within the same pixel, such that the extension length thereof is larger than the width thereof.

FIG. 7A illustrates that the first and second control nodes 710 and 720 include four isolation control nodes 711 to 714 and four isolation control nodes 721 to 724, respectively. However, the present embodiment is not limited thereto, but each of the control nodes may include a random number of isolation control nodes equal to or more than two, and the widths and extension lengths of the isolation control nodes may be experimentally decided. Furthermore, the widths and extension lengths of the isolation control nodes may be equal to one another, or different from one another. For example, the extension lengths and widths of the isolation control nodes may be gradually decreased from the center toward the edge of the control node.

Figure 7B:
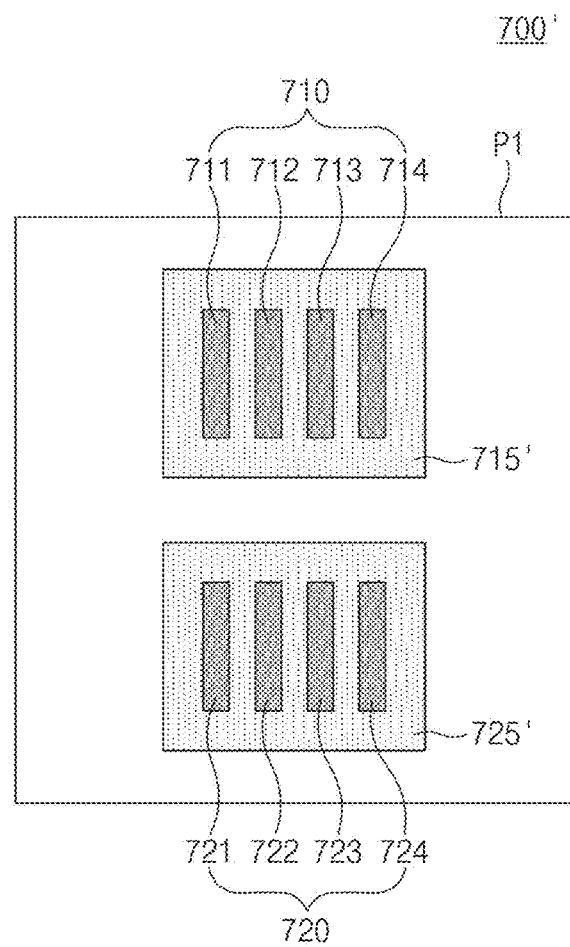
FIG. 7B is a plan view illustrating another embodiment of a detection node included in the pixel illustrated in FIG. 7A.

FIG. 7B is a plan view illustrating another embodiment of the detection node included in the pixel illustrated in FIG. 7A.

FIG. 7B illustrates a plan view 700' including a first pixel P1 having detection nodes 715' and 725' which have different shapes from the detection nodes 715 and 725 illustrated in FIG. 7A. That is, no separate insulating layer may be disposed between the first control node 710 and the first detection node 715' and between the second control node 720 and the second detection node 725', and the first detection node 715' and the second detection node 725' may be formed to surround the first control node 710 and the second control node 720 while abutting on the first control node 710 and the second control node 720, respectively. In this case, the first control node 710 and the first detection node 715' may be physically isolated only by junction isolation, and the second control node 720 and the second detection node 725' may also be physically isolated only by junction isolation.

Since the first pixel P1 of FIG. 7B is configured and operated in substantially the same manner as the first pixel P1 of FIG. 7A except the shapes of the first and second detection nodes, the same descriptions will be omitted herein.

Figure 8A:
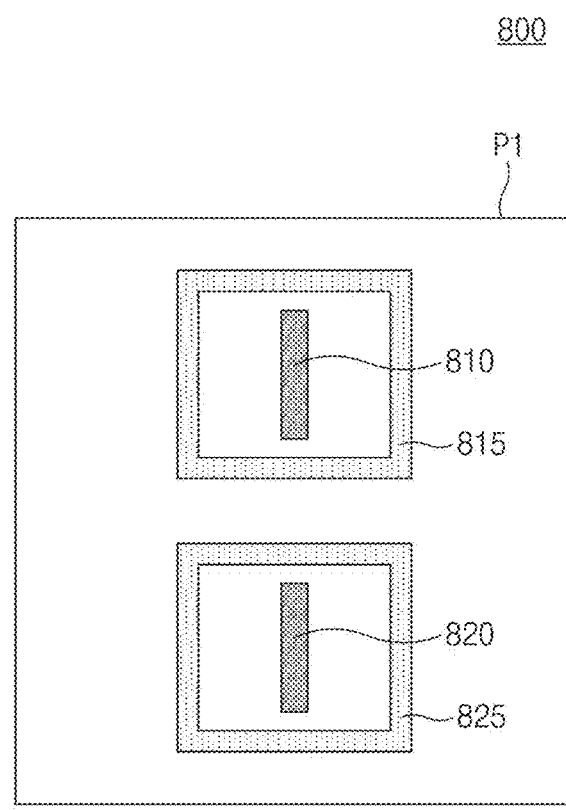
FIG. 8A is a plan view illustrating yet another embodiment of the control node included in the pixel illustrated in FIG. 2A.

FIG. 8A is a plan view illustrating yet another embodiment of the control node included in the pixel illustrated in FIG. 2A.

FIG. 8A illustrates yet another embodiment 800 of the first and second control nodes included in the first pixel P1 of FIG. 2A. Since a first pixel P1 of FIG. 8A is configured and operated in substantially the same manner as the first pixel P1 of FIG. 2A except the shapes of first and second control nodes 810 and 820, the following descriptions will be focused on differences from FIG. 2A, in order to avoid repeating the same descriptions. Furthermore, since the shapes of the first and second control nodes 810 and 820 are similar to the shapes of the first and second control nodes 710 and 720 of FIG. 7A, the following descriptions will be focused on a difference in shape from FIG. 7A. Furthermore, only the first pixel P1 will be described for convenience of description, but it is obvious that substantially the same structure may be applied to the other pixels.

The first control node 810 may be formed in such a shape that the extension length thereof in the vertical direction is larger than the width thereof in the horizontal direction. Compared to FIG. 7A, the first control node 810 may correspond to the shape in which any one of the plurality of first isolation control nodes 711 to 714 included in the first control node 710 of FIG. 7A is included.

The second control node 820 may be formed in such a shape that the extension length thereof in the vertical direction is larger than the width thereof in the horizontal direction. Compared to FIG. 7A, the second control node 820 may correspond to the shape in which any one of the plurality of second isolation control nodes 721 to 724 included in the second control node 720 of FIG. 7A is included.

Since each of the first and second control nodes 810 and 820 is formed in a shape to include only any one of the plurality of isolation control nodes unlike the structure of FIG. 7A, the current path between the control nodes within the same pixel and the current path between the control nodes of the adjacent pixels may be decreased to reduce the hole current, which makes it possible to reduce the power consumption of the pixel array 30.

Figure 8B:
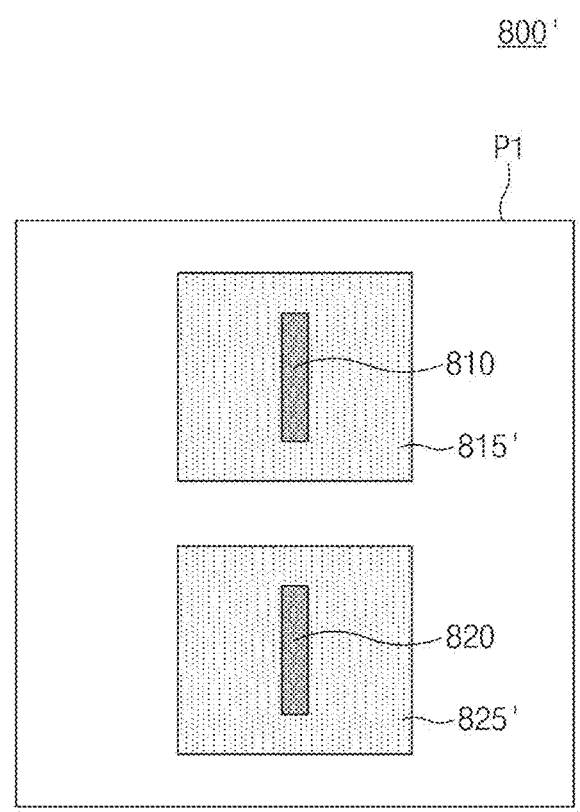
FIG. 8B is a plan view illustrating another embodiment of a detection node included in the pixel illustrated in FIG. 8A.

FIG. 8B is a plan view illustrating another embodiment of the detection node included in the pixel illustrated in FIG. 8A.

FIG. 8B illustrates a plan view 800' including a first pixel P1 which has detection nodes 815' and 825' having different shapes from detection nodes 815 and 825 illustrated in FIG. 8A. That is, no separate insulating layer may be disposed between the first control node 810 and the first detection node 815' and between the second control node 820 and the second detection node 825', and the first detection node 815' and the second detection node 825' may be formed to surround the first control node 810 and the second control node 820 while abutting on the first control node 810 and the second control node 820, respectively. In this case, the first control node 810 and the first detection node 815' may be physically isolated only by junction isolation, and the second control node 820 and the second detection node 825' may also be physically isolated only by junction isolation.

Since the first pixel P1 of FIG. 8B is configured and operated in substantially the same manner as the first pixel P1 of FIG. 8A except the shapes of the first and second detection nodes, the same descriptions will be omitted herein.

Figure 9:
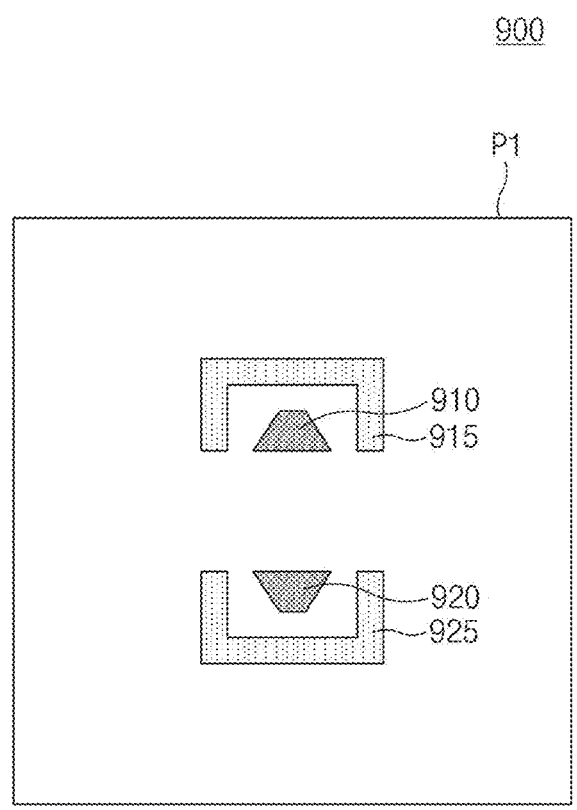
FIG. 9 is a plan view illustrating still another embodiment of the detection node included in the pixel illustrated in FIG. 2A.

FIG. 9 is a plan view illustrating still another embodiment of the detection nodes included in the pixel illustrated in FIG. 2A.

FIG. 9 illustrates still another embodiment 900 of the first and second detection nodes included in the first pixel P1 of FIG. 2A. Since a first pixel P1 of FIG. 9 is configured and operated in substantially the same manner as the first pixel P1 of FIG. 2A except the shapes of first and second detection nodes 915 and 925, the following descriptions will be focused on differences from FIG. 2A, in order to avoid repeating the same descriptions. Furthermore, only the first pixel P1 is described for convenience of description, but it is obvious that substantially the same structure may be applied to the other pixels.

The first detection node 915 may have a shape to surround the left, the right and the top of a first control node 910. The first detection node 915 may have a shape that does not surround the bottom of the first control node 910. Thus, the first detection node 910 has an opening in a direction facing the other detection node 925 within the same pixel. For example, the opening of the first detection node is disposed around the middle part of the first detection node 915.

The second detection node 925 may have a shape to surround the left, the right and the bottom of a second control node 920. The second detection node 925 may have a shape that does not surround the top of the second control node 920. Thus, the second detection node 920 has an opening in a direction facing the other detection node 915 within the same pixel. For example, the opening of the second detection node 920 is disposed around the middle part of the second detection node 925.

As illustrated in FIG. 3A, the detection node may be not only formed adjacent to the control node so as to capture electrons migrated by the hole current, but also disposed between the adjacent control nodes so as to lengthen the current path of the hole current. When it is assumed in FIG. 3A that the first and second detection nodes 215 and 225 disposed between the first and second control nodes 210 and 220 are not present, the current path of the hole current flowing between the first and second control nodes 210 and 220 may be shortened. This structure may cause the same effect as the distance between the first and second control nodes 210 and 220 is reduced.

Since the first detection node 915 does not surround the bottom of the first control node 910 and the second detection node 925 does not surround the top of the second control node 920, the current path between the first and second control nodes 910 and 920 may be shortened more than in FIG. 2A. Therefore, the resistance between the first and second control nodes 910 and 920 may be reduced to increase the hole current flowing between the first and second control nodes 910 and 920.

Since the first detection node 915 surrounds the left, right and top of the first control node 910 and the second detection node 925 surrounds the left, right and bottom of the second control node 920, the length of the current path between any one of the first and second control nodes 910 and 920 and the control node of another adjacent pixel may be maintained as in FIG. 2A. Therefore, the first and second detection nodes 915 and 925 may relatively increase the resistances and the length of the current paths between any one of the first and second control nodes 910 and 920 and the control node of another adjacent pixel, thereby reducing crosstalk between the adjacent pixels.

Figure 10:
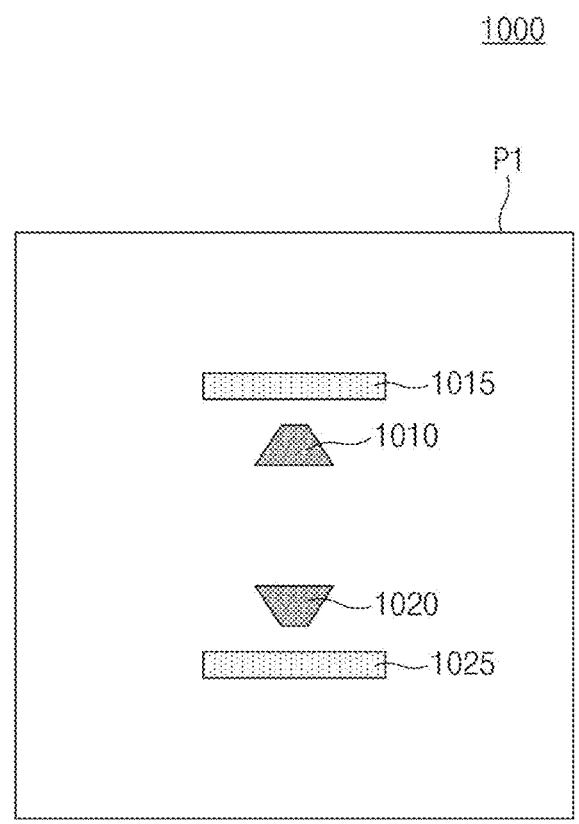
FIG. 10 is a plan view illustrating yet another embodiment of the detection node included in the pixel illustrated in FIG. 2A.

FIG. 10 is a plan view illustrating yet another embodiment of the detection node included in the pixel illustrated in FIG. 2A.

FIG. 10 illustrates yet another embodiment 1000 of the first and second detection nodes included in the first pixel P1 of FIG. 2A. Since a first pixel P1 of FIG. 10 is configured and operated in substantially the same manner as the first pixel P1 of FIG. 2A except the shapes of first and second detection nodes 1015 and 1025, the following descriptions will be focused on differences from FIG. 2A, in order to avoid repeating the same descriptions. Furthermore, only the first pixel P1 is described for convenience of description, but it is obvious that substantially the same structure may be applied to the other pixels.

The first detection node 1015 may have a shape to block the top of a first control node 1010. The first detection node 1015 may have a shape that does not surround the left, right and bottom of the first control node 1010, Thus, the first detection node 1015 may have openings in a direction facing the other detection node 1025 within the same pixel and directions corresponding to the sides of the first control node 1010. For example, the first detection node 1015 may be disposed above the first control node 1010 in a direction further away from the second control node 1020.

The second detection node 1025 may have a shape to block the bottom of a second control node 1020. The second detection node 1025 may be formed in such a shape that does not surround the left, right and top of the second control node 1020. Thus, the second detection node 1025 may have openings in a direction facing the other detection node 1015 within the same pixel and directions corresponding to the sides of the second control node 1020. For example, the second detection node 1025 may be disposed under the second control node 1020 in a direction further away from the first control node 1010.

Since the first detection node 1015 does not surround the left, right and bottom of the first control node 1010 and the second detection node 1025 does not surround the left, right and top of the second control node 1020, the current path through which a hole current between the first and second control nodes 1010 and 1020 can flow may be further increased around the left and right of each of the first and second control nodes 1010 and 1020 than in FIG. 9. Therefore, as the resistance between the first and second control nodes 1010 and 1020 is reduced, the hole current flowing between the first and second control nodes 1010 and 1020 may be increased more than in FIG. 9.

Since the first detection node 1015 blocks the top of the first control node 1010 and the second detection node 1025 blocks the bottom of the second control node 1020, the current path between any one of the first and second control nodes 1010 and 1020 and the control node of another adjacent pixel may be lengthened, thereby reducing crosstalk between the adjacent pixels, and concentrating the current path of the hole current between the first and second control nodes 1010 and 1020.

Figure 11:
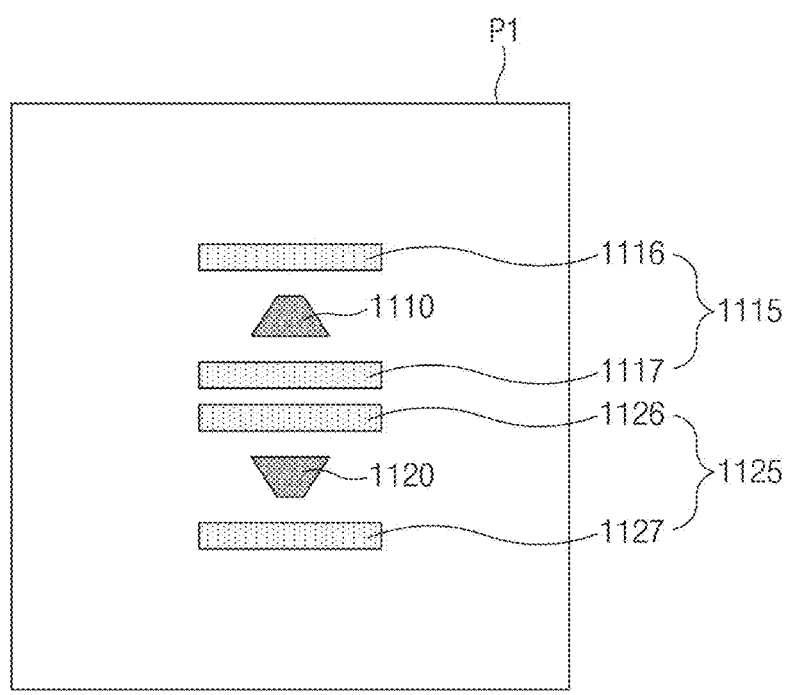
FIG. 11 is a plan view illustrating still yet another embodiment of the detection node included in the pixel illustrated in FIG. 2A.

FIG. 11 is a plan view illustrating yet another embodiment of the detection node included in the pixel illustrated in FIG. 2A.

FIG. 11 illustrates yet another embodiment 1100 of the first and second detection nodes included in the first pixel P1 of FIG. 2A. Since a first pixel P1 of FIG. 11 is configured and operated in substantially the same manner as the first pixel P1 of FIG. 2A except the shapes of first and second detection nodes 1115 and 1125, the following descriptions will be focused on differences from FIG. 2A, in order to avoid repeating the same descriptions. Furthermore, only the first pixel P1 is described for convenience of description, but it is obvious that substantially the same structure may be applied to the other pixels.

The first detection node 1115 may include a top detection node 1116 to block the top of a first control node 1110 and a bottom detection node 1117 to block the bottom of the first control node 1110. The first detection node 1115 may have a shape that does not surround the left and right of the first control node 1110. Thus, the first detection node 1115 may have openings in directions corresponding to side surfaces of the first control node 1110. For example, the first detection node 1115 has portions that are disposed above and below the first control node 1110 along a direction that the first control node 1110 and the second control node 1120 are arranged.

The second detection node 1125 may include a top detection node 1126 to block the top of a second control node 1120 and a bottom detection node 1127 to block the bottom of the second control node 1120. The second detection node 1125 may have a shape that does not surround the left and right of the second control node 1120. Thus, the second detection node 1125 may have openings in directions corresponding to side surfaces of the second control node 1120. For example, the second detection node 1125 has portions that are disposed above and below the second control node 1120 along a direction that the first control node 1110 and the second control node 1120 are arranged.

Since the first detection node 1115 additionally blocks the bottom of the first control node 1110 and the second detection node 1125 additionally blocks the top of the second control node 1120 unlike the structure of FIG. 10, the current path between the first and second control nodes 1110 and 1120 may be lengthened. Therefore, the resistance between the first and second control nodes 1110 and 1120 may be increased to decrease the hole current flowing between the first and second control nodes 1110 and 1120, compared to FIG. 10. Thus, the power consumption of the pixel array 30 may be reduced.

Since the first detection node 1115 blocks the top of the first control node 1110 and the second detection node 1125 blocks the bottom of the second control node 1120, the current path between any one of the first and second control nodes 1110 and 1120 and the control node of another adjacent pixel may be lengthened, thereby reducing crosstalk between the adjacent pixels, and concentrating the current path of the hole current between the first and second control nodes 1110 and 1120.

Figure 12:
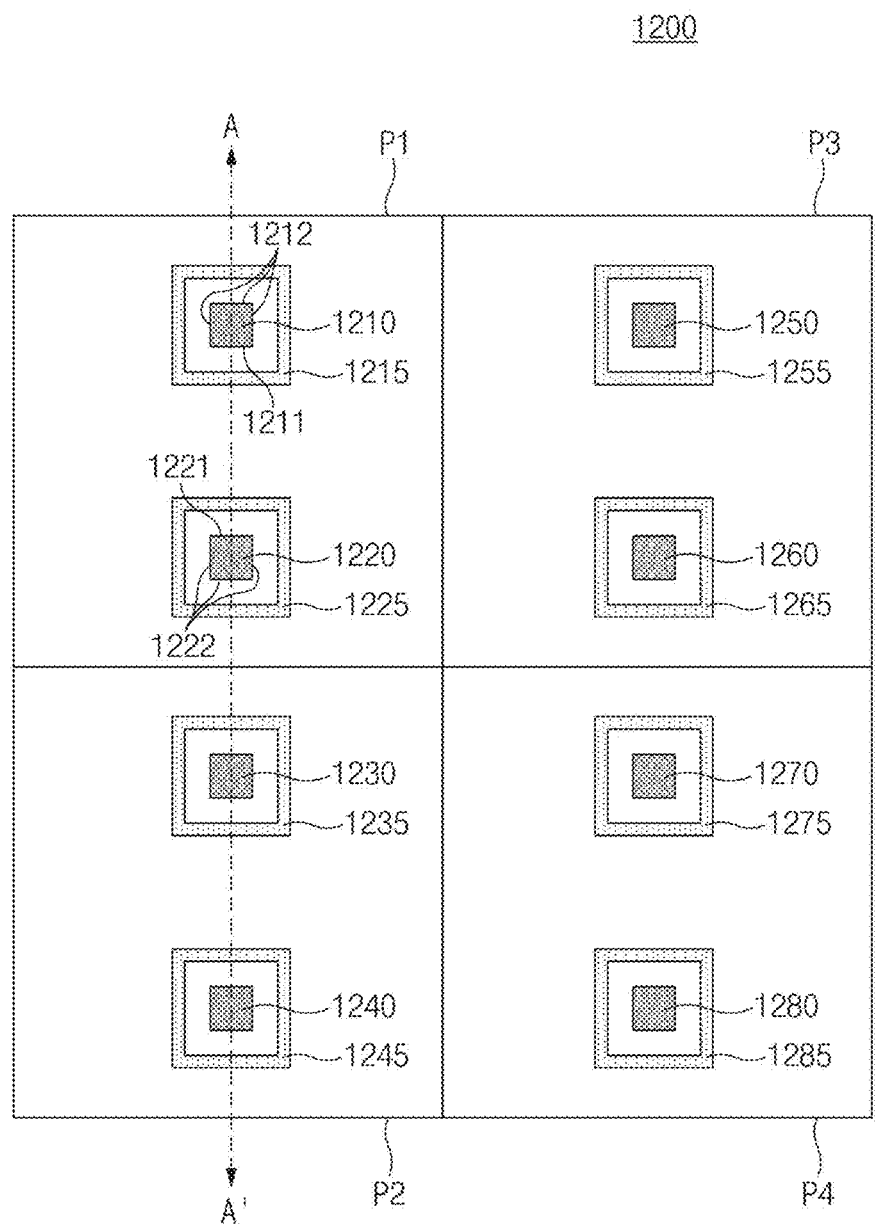
FIG. 12 is a plan view illustrating still another embodiment of the pixel included in the pixel array illustrated in FIG. 1.

FIG. 12 is a plan view illustrating still another embodiment of the pixel included in the pixel array illustrated in FIG. 1.

FIG. 12 illustrates a plan view 1200 including first to fourth pixels P1 to P4 which are arranged in a 2×2 matrix so as to be adjacent to one another, and the pixel array 30 may have a structure in which substantially the same pixels as the first to fourth pixels P1 to P4 are arranged in a matrix shape.

The first to fourth pixels P1 to P4 of FIG. 12 are configured and operated in substantially the same manner as the first to fourth pixels P1 to P4 of FIG. 2A, except the shapes of first and second control nodes 1210, 1220, 1230, 1240, 1250, 1260, 1270 and 1280. Therefore, the following descriptions will be focused on differences from FIG. 2A, in order to avoid repeating the same descriptions.

Each of the first and second control nodes 1210, 1220, 1230, 1240, 1250, 1260, 1270 and 1280 may have a rectangular shape (for example, rectangle or square). The rectangular shape is only an example, and each of the first and second control nodes 1210, 1220, 1230, 1240, 1250, 1260, 1270 and 1280 may have a random shape including a first surface facing the other control node within the same pixel and a plurality of second surfaces which do not face the other control node within the same pixel. For example, the first control node 1210 may have a first surface 1211 facing the second control node 1220 within the same pixel P1 and a plurality of second surfaces 1212 which do not face the second control node 1220 within the same pixel P1. The plurality of second surfaces 1212 may be directly/indirectly connected to the first surface 1211.

Figure 13:
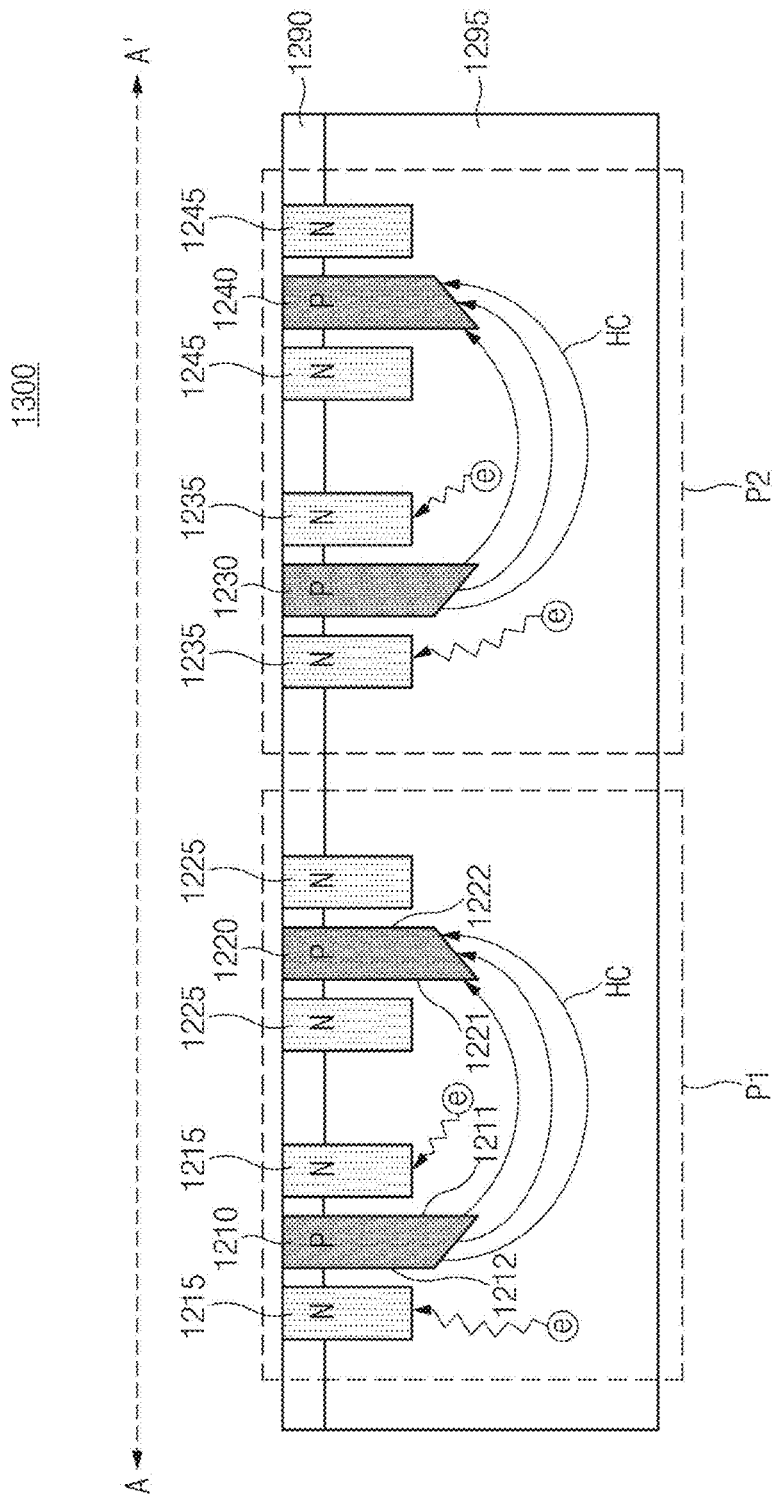
FIG. 13 is a cross-sectional view of the pixel illustrated in FIG. 12.

FIG. 13 is a cross-sectional view of the pixel illustrated in FIG. 12.

FIG. 13 illustrates a cross-section 1300 taken along line A-A' of FIG. 12.

The first and second pixels P1 and P2 of FIG. 13 are configured and operated in substantially the same manner as the first and second pixels P1 and P2 of FIG. 3A, except the shapes of first and second control nodes 1210, 1220, 1230 and 1240. Therefore, the following descriptions will be focused on differences from FIG. 3A, in order to avoid repeating the same descriptions.

First, the first pixel P1 will be described. The first control node 1210 may have a first surface 1211 facing the second control node 1220 within the same pixel P1 and a plurality of second surfaces 1212 which do not face the second control node 1220 within the same pixel P1. The vertical depth of the first surface 1211 from the top surface of the substrate 1295 may be larger than the vertical depth of any one of the plurality of second surfaces 1212 from the top surface of the substrate 1295. Specifically, the second surface 1212 facing the first surface 1211, among the plurality of second surfaces 1212, may have the smallest vertical depth, and the average vertical depth of the second surfaces 1212 which does not face the first surface 1211, among the plurality of second surfaces 1212, i.e. the second surfaces 1212 directly connected to the first surface 1211, may correspond to a value between the vertical depth of the second surface 1212 facing the first surface 1211 and the vertical depth of the first surface 1211. This is because the vertical depth of one of the second surfaces 1212 which do not face the first surface 1211 is equal to the vertical depth of the second surface 1212 facing the first surface 1211, the vertical depth of the other of the second surfaces 1212 which do not face the first surface 1211 is equal to the vertical depth of the first surface 1211, and the vertical depth gradually increases from the one toward the other.

The second control node 1220 may have a first surface 1221 facing the first control node 1210 within the same pixel P1 and a plurality of second surfaces 1222 which do not face the first control node 1210 within the same pixel P1. The vertical depth of the first surface 1221 from the top surface of the substrate 295 may be larger than the vertical depth of any one of the plurality of second surfaces 1222 from the top surface of the substrate 295. Specifically, the second surface 1222 facing the first surface 1221, among the plurality of second surfaces 1222, may have the smallest vertical depth, and the average vertical depth of the second surfaces 1222 which does not face the first surface 1221, among the plurality of second surfaces 1222, i.e. the second surfaces 1222 directly connected to the first surface 1221, may correspond to a value between the vertical depth of the second surface 1222 facing the first surface 1221 and the vertical depth of the first surface 1221. This is because the vertical depth of one of the second surfaces 1222 which do not face the first surface 1221 is equal to the vertical depth of the second surface 1222 facing the first surface 1221, the vertical depth of the other of the second surfaces 1222 which do not face the first surface 1221 is equal to the vertical depth of the first surface 1221, and the vertical depth gradually increases from the one toward the other.

Therefore, the areas of the first surfaces 1211 and 1221 may be larger than the area of any one of the plurality of second surfaces 1212 and 1222.

The first and second control nodes 1210 and 1220 having such an inclined cross-section may be implemented through at least one of tilt, angle and rotation methods during an implant process.

Since the second pixel P2 is configured and operated in substantially the same manner as the first pixel P1, the detailed descriptions thereof are omitted herein.

Therefore, considering the magnitudes of hole currents between the second control node 1220 and the control nodes 1210 and 1230 therearound, the hole current flowing between the second control node 1220 and the first control node 1210 has the largest magnitude, because the first control node 1210 is the closest to the second control node 1220 and its surface facing the second control node 1220 has the largest area. Furthermore, the hole currents between the second control node 1220 and the first control node 1230 have relatively small magnitude, because the first control node 1230 is relatively remote from the second control node 1220 and its surface facing the second control node 1220 has relatively narrow area.

Therefore, crosstalk between adjacent pixels may be reduced, and unnecessary power consumption may be reduced.

FIGS. 12 and 13 are based on the supposition that the first and second control nodes have a rectangular shape. As described above, however, the first and second control nodes have be formed in a random shape having the first surface and the plurality of second surfaces. Furthermore, according to another embodiment, the first and second demodulation nodes may have a plane shape in accordance with any one of the various embodiments described with FIGS. 2A to 11, and the first surfaces of the first and second control nodes may have a larger depth than any one of the plurality of second surfaces of each of the first and second control nodes. That is, the vertical shapes described with reference to FIGS. 12 and 13 and the plane shapes described with reference to FIGS. 2A to 11 may be implemented in combination.

In accordance with various embodiments, it is possible to not only minimize crosstalk between adjacent pixels and the power consumption of the entire pixel array, but also improve the transmission efficiency of a hole current flowing in a unit pixel. Therefore, although the size of the CAPD pixel is reduced, the pixel may be designed to have the optimal performance.

In accordance with various embodiments, each of the above-described components (for example, module or program) may include a single object or a plurality of objects. In accordance with various embodiments, one or more components of the above-described components or one or more operations may be omitted, or one or more other components or operations may be added. Alternatively or additionally, a plurality of components (for example, modules or programs) may be merged into one component. In this case, the merged component may perform one or more functions of each of the plurality of components in the same or similar manner as or to the corresponding component among the plurality of components before the merge. In accordance with various embodiments, operations performed by modules, programs or other components may be performed sequentially, in parallel, repeatedly or heuristically, one or more of the operations may be performed in another order or omitted, or one or more other operations may be added.

While certain embodiments have been described above, it will be understood to those skilled in the art that the embodiments described are by way of example only. Accordingly, the pixel and the image sensor described herein should not be limited based on the described embodiments. Rather, the pixel and the image sensor described herein should only be limited in light of the claims that follow when taken in conjunction with the above description and accompanying drawings.

What is claimed is:

1. A pixel included in an image sensor, comprising:
a first control node and a second control node, each configured to receive control signals and generate a hole current in a substrate in response to the control signals; and
a first detection node and a second detection node that are arranged to correspond to the first control node and the second control node, respectively, and configured to capture electrons which are generated by incident light in the substrate and move by the hole current,
wherein each of the first and second control nodes has a shape including a first surface and second surfaces connected to the first surface and the first surfaces of the first control node and the second control node are disposed to face each other, and
an area of the first surface is larger than an area of any one of the second surfaces.

2. The pixel of claim 1, wherein the first surface of the first control node is closer to the second control node as compared to the second surfaces of the first control node.

3. The pixel of claim 1, wherein each of the first and second control nodes has a trapezoidal shape.

4. The pixel of claim 1, wherein a first demodulation node including the first control node and the first detection node and a second demodulation node including the second control node and the second detection node are disposed in a diagonal direction.

5. The pixel of claim 4, wherein the first control node and the second control node are arranged at predetermined angle with respect to one side of the pixel.

6. The pixel of claim 1, wherein the first control node and the second control node includes one or more protrusions which extend toward the second control node and the first control node, respectively.

7. The pixel of claim 1, wherein the first control node and the second control node includes a plurality of protrusions which extend toward the second control node and the first control node respectively, the plurality of protrusions being arranged to be apart from each other.

8. The pixel of claim 7, wherein a protrusion of the plurality of the protrusions disposed in a center of the corresponding control node has a width or extension length different from that of another protrusion disposed at the edge of the corresponding control node.

9. The pixel of claim 1, wherein the first detection node and the second detection node are formed to surround the first and second control nodes, respectively.

10. The pixel of claim 1, wherein each of the first detection node and the second detection node has an opening around a middle part of each of the first detection node and the second detection node.

11. The pixel of claim 1, wherein the first detection node and the second detection node are disposed above and below the first control node and the second control node, respectively.

12. The pixel of claim 1, wherein each of the first detection node and the second detection node has portions that are disposed in a direction in which the first control node and the second control node are arranged.

13. The pixel of claim 1, wherein the pixel is configured to include a CAPD (Current-Assisted Photonic Demodulator) pixel.

14. The pixel of claim 1, wherein a first demodulation control signal is applied to the first control node and a second demodulation control signal is applied to the second control node, the first control node and the second control node having different voltages from each other.

15. The pixel of claim 1, wherein the first surface has a larger horizontal length than that of any one of the second surfaces.

16. The pixel of claim 1, wherein the first surface has a larger vertical depth than that of any one of the second surfaces.

17. An image sensor comprising pixels that detect incident light to produce pixel signals indicative of an image carried by the incident light,
wherein the pixels include a first CAPD (Current-Assisted Photonic Demodulator) pixel and a second CAPD pixel that are arranged adjacent to each other,
wherein a control node of the first CAPD pixel comprises a first surface facing another control node of the first CAPD pixel and a second surface facing a control node of the second CAPD pixel, and
the first surface has a larger area than an area of the second surface.

18. The image sensor of claim 17, wherein the control node of the first CAPD pixel is configured to receive a control signal and generate a hole current in a substrate of the image sensor.

19. The image sensor of claim 17, wherein the control node of the first CAPD pixel has a polygonal shape formed to include the first surface and the second surface.

20. The image sensor of claim 17, further comprising a detection node disposed around the control node of the first CAPD pixel and configured to capture electrons generated by incident light.

* * * * *